(12) United States Patent
Kawai et al.

(10) Patent No.: US 9,559,697 B2
(45) Date of Patent: Jan. 31, 2017

(54) TRANSMITTER CIRCUIT AND SEMICONDUCTOR INTEGRATED CIRCUIT

(71) Applicant: Socionext Inc., Yokohama-shi, Kanagawa (JP)

(72) Inventors: Shigeaki Kawai, Kawasaki (JP); Nobumasa Hasegawa, Kawasaki (JP)

(73) Assignee: SOCIONEXT, INC., Yokohama (JP)

( * ) Notice: Subject to any disclaimer, the term of this patent is extended or adjusted under 35 U.S.C. 154(b) by 0 days.

(21) Appl. No.: 14/843,674

(22) Filed: Sep. 2, 2015

(65) Prior Publication Data

US 2016/0094227 A1 Mar. 31, 2016

(30) Foreign Application Priority Data

Sep. 29, 2014 (JP) ................. 2014-197955

(51) Int. Cl.
*H03K 3/00* (2006.01)
*H03K 19/0185* (2006.01)
*H03K 17/687* (2006.01)

(52) U.S. Cl.
CPC .... *H03K 19/018528* (2013.01); *H03K 17/687* (2013.01)

(58) Field of Classification Search
None
See application file for complete search history.

(56) References Cited

U.S. PATENT DOCUMENTS

| 6,326,819 | B1 * | 12/2001 | Carlson | H03K 17/163 326/83 |
| 7,932,749 | B2 * | 4/2011 | Wu | H03K 19/0185 326/83 |
| 8,183,893 | B2 * | 5/2012 | Kojima | H04L 25/028 327/108 |
| 2010/0271080 | A1 * | 10/2010 | Kojima | H04L 25/028 327/108 |
| 2013/0343471 | A1 | 12/2013 | Suzuki et al. | |

FOREIGN PATENT DOCUMENTS

JP 2014-007654 A 1/2014

* cited by examiner

*Primary Examiner* — Long Nguyen
(74) *Attorney, Agent, or Firm* — Arent Fox LLP

(57) ABSTRACT

A transmitter circuit includes: a driver that includes an output resistor set to a resistance value according to an input code, and that outputs, to an output terminal, an output signal; and a high potential side resistor and a low potential side resistor that are connected to the output terminal. The transmitter circuit further includes a high potential side current source that is set with a current value according to the input code, and a low potential side current source that is set with a current value according to the input code. The transmitter circuit further includes a high potential side switch and a low potential side switch that switch between allowing current output from the high voltage side current source and the low voltage side current source to pass, and blocking the current.

20 Claims, 19 Drawing Sheets

FIG.15

| $R_{LSB}$ | $R_a$ | $R_t$ | tc | tcx | OUTPUT RESISTANCE | COMPARATIVE EXAMPLE (WITHOUT CURRENT SOURCE) | EXAMPLE (WITH CURRENT SOURCE) |
|---|---|---|---|---|---|---|---|
| 700Ω | 700Ω | 58.3Ω | 12 | 19 | 50Ω | 0.857V | 0.952V |
| 1000Ω | 1000Ω | 55.6Ω | 18 | 13 | 50Ω | 0.900V | 0.965V |
| 1300Ω | 1300Ω | 54.2Ω | 24 | 7 | 50Ω | 0.923V | 0.958V |

TRANSMITTER CIRCUIT AND SEMICONDUCTOR INTEGRATED CIRCUIT

CROSS-REFERENCE TO RELATED APPLICATION

This application is based upon and claims the benefit of priority of the prior Japanese Patent Application No. 2014-197955, filed on Sep. 29, 2014, the entire contents of which are incorporated herein by reference.

FIELD

The embodiments discussed herein are related to a transmitter circuit and a semiconductor integrated circuit.

BACKGROUND

A known semiconductor device includes a signal signaling circuit provided with a driver circuit that outputs complementary voltages to signaling paths, and a first voltage source that uses a voltage supplied to the driver circuit as an operation voltage to adjust the amplitude of the complementary voltages output to the signaling path from the driver circuit. The driver circuit includes a complementary inverter formed from plural transistor switches that produce a specific impedance by operating one of a pair of transistors in the saturated region, and operating the other transistor in the triode region. The transistor switches are each driven based on complementary signals so as to output complementary voltages to the signaling paths.

Related Patent Documents

Japanese Laid-Open Patent Publication No. 2014-7654

SUMMARY

According to an aspect of the embodiments, a transmitter circuit includes: a driver that includes an output resistor set to a resistance value according to an input code, and that outputs, to an output terminal, an output signal according to an input signal; a high potential side resistor provided between the output terminal and a high potential line supplied with a first voltage; a low potential side resistor provided between the output terminal and a low potential line supplied with a second voltage that is lower than the first voltage; a high potential side current source that is provided between the output terminal and the high potential line, that is set with a first current value according to the input code, and that outputs a current from the high potential line toward the output terminal; a low potential side current source that is provided between the output terminal and the low potential line, that is set with a second current value according to the input code, and that outputs a current from the output terminal toward the low potential line; a high potential side switch that is provided between the output terminal and the high potential line, that allows the current output from the high potential side current source to pass through in an ON state, and that blocks the current output from the high potential side current source in an OFF state; and a low potential side switch that is provided between the output terminal and the low potential line, that allows the current output from the low potential side current source to pass through in an ON state, and that blocks the current output from the low potential side current source in an OFF state.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 15 is a table of results found by calculating a variation in output amplitude when resistance values of a high potential side resistor and a low potential side resistor vary, in a transmitter circuit according to technology disclosed herein and a transmitter circuit according to a comparative example.

DESCRIPTION OF EMBODIMENTS

Figure 1:
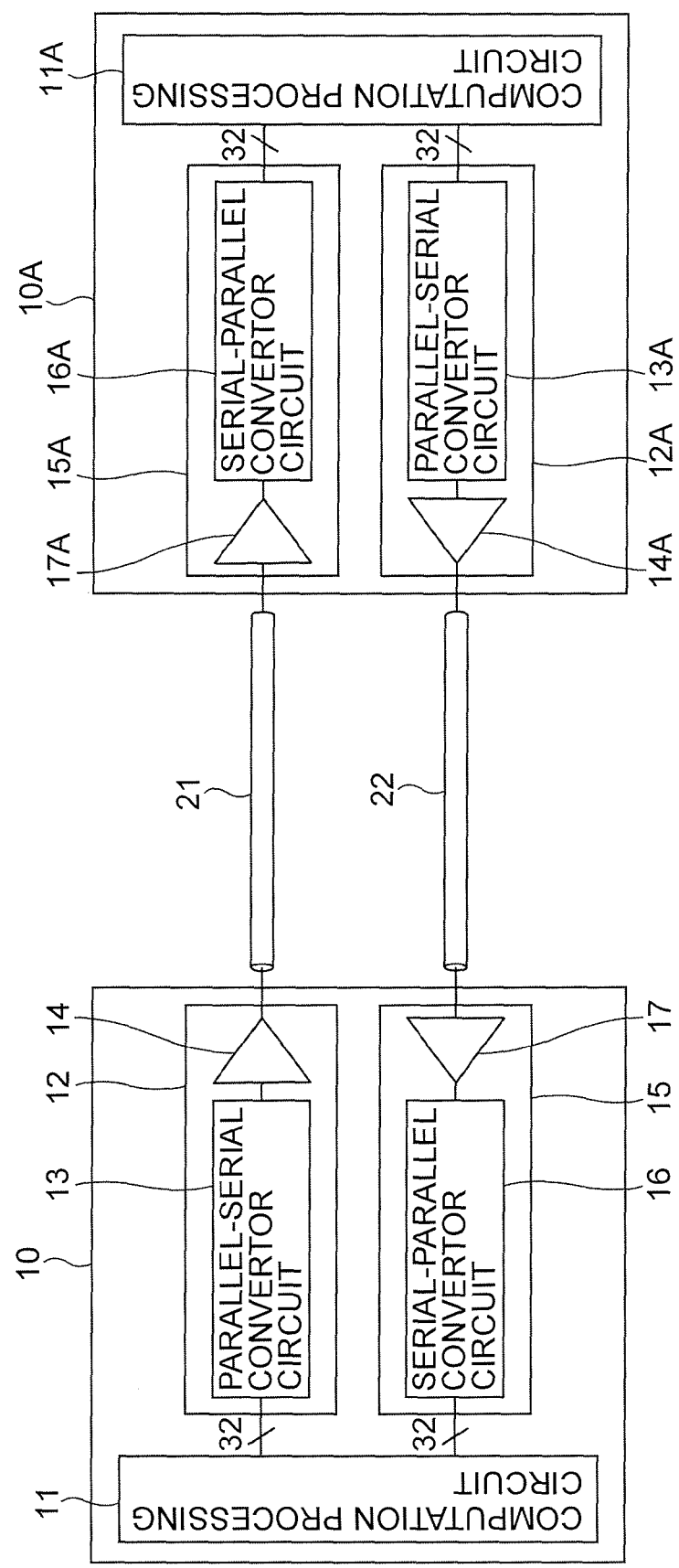
FIG. 1 is a block diagram illustrating a configuration of a semiconductor integrated circuit including a transmitter circuit according to an exemplary embodiment of technology disclosed herein.

High speed interface circuits are circuits employed in, for example, transmitting and receiving digital data between semiconductor chips, and generally include a reception section and a transmission section. The function of the transmission section is to convert, for example, 32-bit parallel data into serial data, and to send the serial data to the reception section of another chip.

Ordinarily, the output amplitude of the transmitter circuit is determined by a specification, and is adjusted so as to be, for example, from 900 mV to 1000 mV. The output impedance of the transmitter circuit is preferably matched with the characteristic impedance of a signaling path, and the resistance value of the output impedance of the transmitter circuit is also determined by a specification.

The transmitter circuit may be configured to include plural resistor elements in order to set the output amplitude and output impedance of the transmitter circuit to desired magnitudes. For example, the transmitter circuit may include an output resistor provided with a driver configured including a complementary MOS (C-MOS) inverter circuit or the like, a high potential side resistor provided between a high potential line and an output terminal, and a low potential side resistor provided between a low potential line and the output terminal. The high potential side resistor and the low potential side resistor are used to adjust the output amplitude of the transmitter circuit to the desired magnitude. According to this configuration, the resistance value of the output impedance of the transmitter circuit is applied as a resistance value that is the combined resistance of the output resistor, the high potential side resistor, and the low potential side resistor. Moreover, the output amplitude of the transmitter circuit is determined by a ratio between the output resistor, and the high potential side resistor and low potential side resistor.

The output resistor, the high potential side resistor, and the low potential side resistor are each configured by a semiconductor, and have resistance values that vary according to process, supply voltage, and temperature (PVT). There is a concern that the magnitude of the output amplitude and the resistance value of the output impedance of the transmitter circuit may deviate from their specifications when the resistance values of the output resistor, the high potential side resistor, and the low potential side resistor vary. A method in which the output resistor, the high potential side resistor, and the low potential side resistor are each configured as variable resistors is a conceivable method for suppressing variation in the output amplitude and the output impedance that accompany resistance value variation in the transmitter circuit. In such cases however, the circuit surface area is made very large, and the number and length of wires connected to output terminals in the transmitter circuit increase. As a result, there is a concern that parasitic resistances and parasitic capacitances connected to the output terminals may increase, and the output amplitude will decrease at high frequencies.

A method is conceivable in which, out of the output resistor, the high potential side resistor, and the low potential side resistor, only the output resistor is configured as a variable resistor, in an attempt to avoid the increase in circuit surface area. According to this method, the output impedance of the transmitter circuit can be set to the desired value by adjusting the resistance value of the output resistor according to resistance value variation caused by PVT. However, there is a concern that the magnitude of the output amplitude may deviate from the specification since the resistance values of the high potential side resistor and low potential side resistor are not adjustable. Namely, when the output resistor is configured as a variable resistor, and the high potential side resistor and low potential side resistor are configured as fixed resistors, it is sometimes difficult for the output impedance and the output amplitude to both simultaneously meet their specifications.

Explanation follows regarding an example of an exemplary embodiment of technology disclosed herein, with reference to the drawings. Note that in each of the drawings, identical and equivalent configuration elements and sections are allocated the same reference numerals.

FIG. 1 is a block diagram illustrating a configuration of a semiconductor integrated circuit 10 that includes a transmitter circuit 14 according to the exemplary embodiment of technology disclosed herein. The semiconductor integrated circuit 10 is an integrated circuit formed on a semiconductor chip, and has a function of performing transmission and reception of digital data with another connected semiconductor integrated circuit 10A via signaling paths 21, 22. The semiconductor integrated circuit 10 includes a computation processing circuit 11, a transmission section 12, and a reception section 15. The transmission section 12 includes a parallel-serial convertor circuit 13, and a transmitter circuit 14. The reception section 15 includes a serial-parallel convertor circuit 16, and a receiver circuit 17.

The computation processing circuit 11 includes a logic circuit that performs specific computation processing, outputs computation processing results as, for example, 32-bit parallel data, and supplies the 32-bit parallel data to the parallel-serial convertor circuit 13. The parallel-serial convertor circuit 13 converts the parallel data output from the computation processing circuit 11 into serial data for output, and supplies the serial data to the transmitter circuit 14. The transmitter circuit 14 transmits, to the signaling path 21, output signals having logical levels corresponding to the serial data output from the parallel-serial convertor circuit 13. The output signals output from the transmitter circuit 14 are supplied to the semiconductor integrated circuit 10A via the signaling path 21.

Output signals output from the semiconductor integrated circuit 10A, however, are supplied to the semiconductor integrated circuit 10 via the signaling path 22. The output signals from the semiconductor integrated circuit 10A are received by the receiver circuit 17 of the semiconductor integrated circuit 10, and are supplied to the computation processing circuit 11 after conversion to, for example, 32-bit parallel data by the serial-parallel convertor circuit 16. The transmission section 12 and the reception section 15 of the semiconductor integrated circuit 10 configure what is known as a serializer/deserializer (SerDes).

The semiconductor integrated circuit 10A is configured similarly to the semiconductor integrated circuit 10. Namely, the semiconductor integrated circuit 10A includes a reception section 15A that receives the output signals from the semiconductor integrated circuit 10, and a transmission section 12A that supplies computation results by a computation processing circuit 11A to the semiconductor integrated circuit 10 via the signaling path 22. The reception section 15A includes a receiver circuit 17A and a serial-parallel convertor circuit 16A, and the transmission section 12A includes a parallel-serial convertor circuit 13A and a transmitter circuit 14A.

The semiconductor integrated circuits 10 and 10A may be mounted on the same printed substrate, or may be mounted on different printed substrates. Moreover, the semiconductor integrated circuits 10 and 10A may be mounted to different devices from each other. For example, the semiconductor integrated circuit 10 may be mounted to a router, and the semiconductor integrated circuit 10A may be mounted to a server.

Explanations is given herein regarding transmitter circuits according to comparative examples before explanation is given regarding a transmitter circuit according to the exemplary embodiment of technology disclosed herein.

Figure 2:
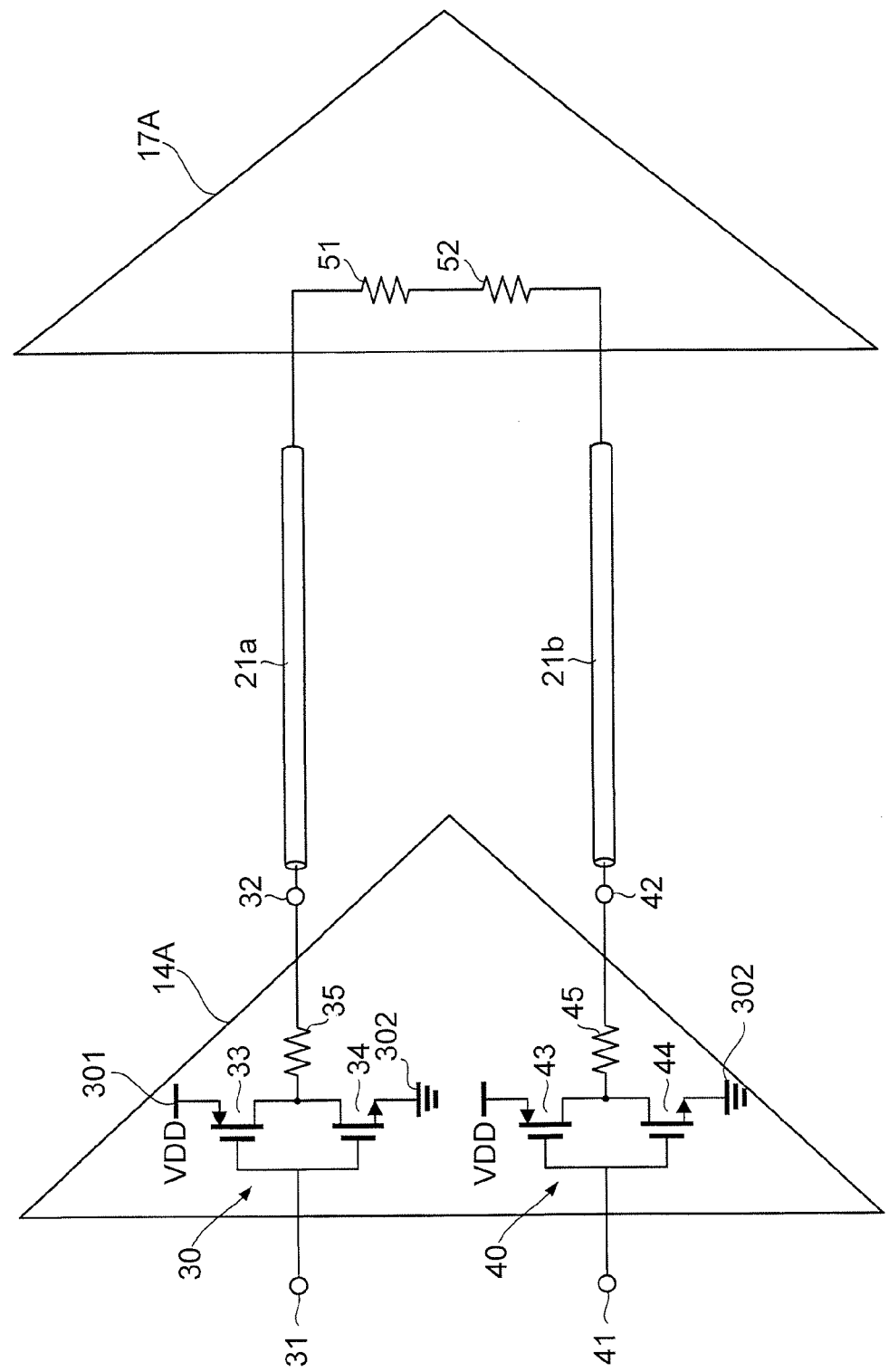
FIG. 2 is a circuit diagram illustrating a configuration of a transmitter circuit according to a first comparative example.

FIG. 2 is a circuit diagram illustrating a configuration of a transmitter circuit 14A according to a first comparative example. FIG. 1 illustrates a case of a configuration that performs single-ended signaling as data signaling between the semiconductor integrated circuits 10 and 10A from the viewpoint of avoiding complicating the drawing; however, FIG. 2 illustrates a configuration that employs a differential signaling method. Moreover, FIG. 2 also illustrates the receiver circuit 17A.

The transmitter circuit 14A includes a non-inverted phase side source-series terminated (SST) driver 30 and an inverted phase side SST driver 40 that implement data signaling using differential signaling. The non-inverted phase side SST driver 30 includes an inverter circuit provided with a serially connected P-MOS transistor 33 and N-MOS transistor 34 between a high potential line 301 and a low potential line 302. Namely, the source of the P-MOS transistor 33 is connected to the high potential line 301 that is supplied with a power source voltage VDD, and the drain of the P-MOS transistor 33 is connected to the drain of the N-MOS transistor 34. The source of the N-MOS transistor 34 is connected to the low potential line 302 that is supplied with a reference voltage (0V). The gates of the P-MOS transistor 33 and the N-MOS transistor 34 are connected to a common input terminal 31. The SST driver 30 includes an output resistor 35 provided between a point connecting the P-MOS transistor 33 to the N-MOS transistor 34, and an output terminal 32. The output terminal 32 is connected to an input terminal on the non-inverted phase side of the receiver circuit 17A via a signaling path 21a.

The inverted phase side SST driver 40 has a similar configuration to non-inverted phase side the SST driver 30. Namely, the SST driver 40 includes an input terminal 41, an output terminal 42, a P-MOS transistor 43, an N-MOS transistor 44, and an output resistor 45. The output terminal 42 is connected to inverted phase side input terminal of the receiver circuit 17A via a signaling path 21b.

Input signals that are the logical inverse of each other are input to the input terminal 31 of the non-inverted phase side SST driver 30, and the input terminal 41 of the inverted phase side SST driver 40. Differential signals that are the logical inverse of each other are thereby output from the output terminal 32 of the SST driver 30 and the output terminal 42 of the SST driver 40, and the differential signals are supplied to the receiver circuit 17A via signaling paths 21a and 21b.

The receiver circuit 17A includes an input resistor 51 having one end connected to the signaling path 21a, and an input resistor 52 having one end connected to the input resistor 51 and the other end connected to the signaling path 21b. The input resistors 51 and 52 can be considered the load of the transmitter circuit 14.

The output resistors 35, 45 of the SST drivers 30 and 40 are set with resistance values matched to the characteristic impedance of the signaling paths 21a and 21b, respectively (for example, 50Ω). The input resistors 51 and 52 of the receiver circuit 17A are also set with resistance values matched to the characteristic impedance of the signaling paths 21a and 21b, respectively (for example, 50Ω).

Figure 3:
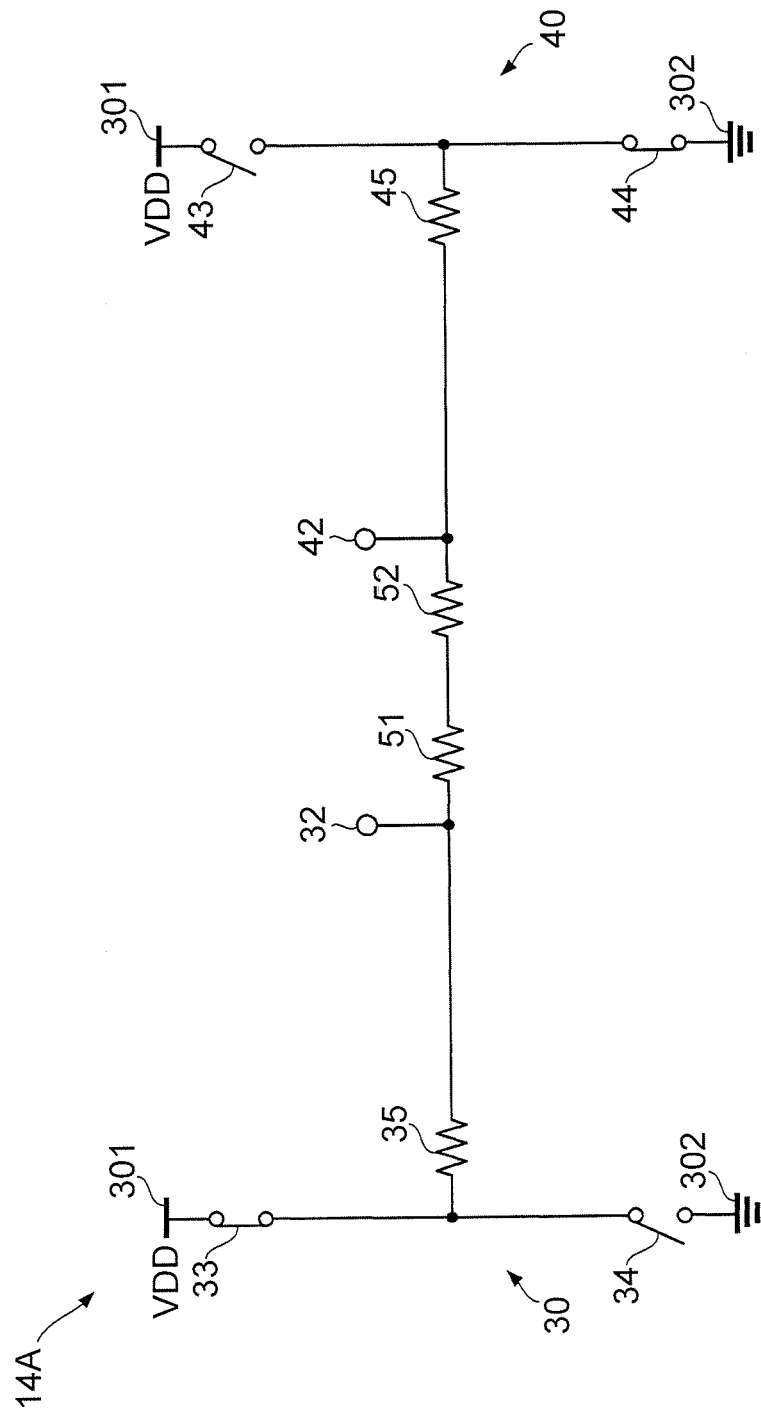
FIG. 3 is a model diagram illustrating a configuration of a transmitter circuit according to a first comparative example.

FIG. 3 is a model diagram simplistically illustrating the transmitter circuit 14A illustrated in FIG. 2. The P-MOS transistor 33 and the N-MOS transistor 34 that configure the non-inverted phase side SST driver 30 illustrated in FIG. 2 are represented by complementary ON and OFF switches in FIG. 3. Hereafter, the P-MOS transistor 33 and the N-MOS transistor 34 are also referred to as the switch 33 and the switch 34, respectively. Similarly, the P-MOS transistor 43 and the N-MOS transistor 44 that configure the inverted phase side SST driver 40 illustrated in FIG. 2 are represented by complementary ON and OFF switches in FIG. 3. Hereafter, the P-MOS transistor 43 and the N-MOS transistor 44 are also referred to as the switch 43 and the switch 44, respectively.

In the transmitter circuit 14A, the output impedance of the non-inverted phase side SST driver 30 is determined by the output resistor 35, and the output impedance of the inverted phase side SST driver 40 is determined by the output resistor 45. The peak-to-peak amplitude of the output signals output from the output terminals 32 and 42 (referred to as output amplitudes hereafter) is VDD/2 at each side, and this becomes VDD for the differential. Namely, the output amplitude of the transmitter circuit 14A is determined by the power source voltage VDD.

Figure 4:
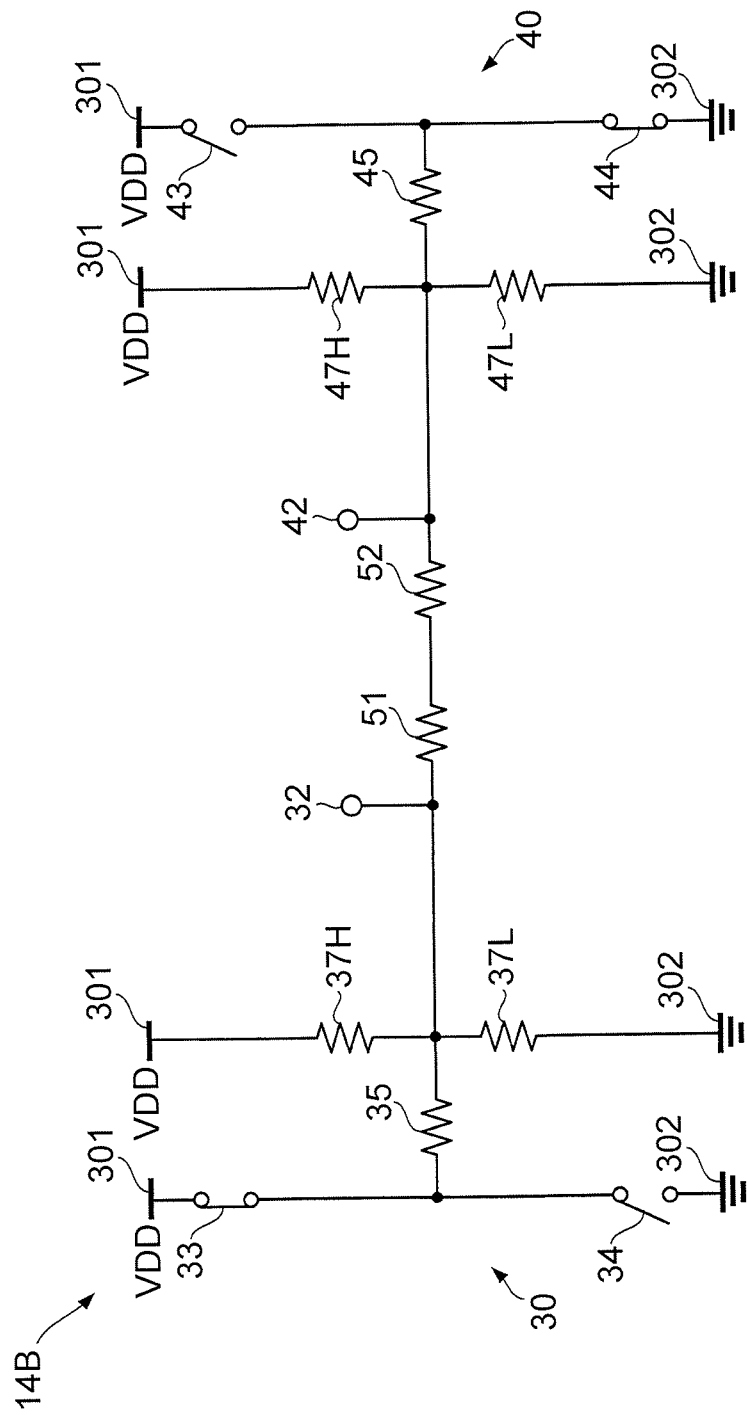
FIG. 4 is a model diagram illustrating a configuration of a transmitter circuit according to a second comparative example.

FIG. 4 is a diagram illustrating a transmitter circuit 14B according to a second comparative example in a similar format to FIG. 3. In FIG. 4, the same reference numerals are allocated to configuration elements the same as, or corresponding to, those of the transmitter circuit 14A according to the first comparative example, and duplicate explanation thereof is omitted.

The transmitter circuit 14B according to the second comparative example has a configuration applicable to cases in which a smaller output amplitude is desired than in the transmitter circuit 14A according to the first comparative example. Namely, the transmitter circuit 14B further includes high potential side resistors 37H and 47H, and low potential side resistors 37L and 47L, for adjusting the output amplitude. The high potential side resistor 37H is provided between the high potential line 301 and the output terminal 32 of the SST driver 30. The low potential side resistor 37L is provided between the low potential line 302 and the output terminal 32 of the SST driver 30. Similarly, the high potential side resistor 47H is provided between the high potential line 301 and the output terminal 42 of the SST driver 40. The low potential side resistor 47L is provided between the low potential line 302 and the output terminal 42 of the SST driver 40. In this manner, the output terminals 32, 42 are connected to the high potential side resistors 37H and 47H respectively, and also to the low potential side resistors 37L and 47L respectively, making the output amplitude of the transmitter circuit 14B smaller than in the transmitter circuit 14A according to the first comparative example. Namely, the high potential side resistors 37H and 47H and the low potential side resistors 37L and 47L have a function of attenuating the output amplitude. The resistance values of each of the resistors 37H, 37L, 47H, and 47L may be the same as each other.

The resistance value of the output impedance of the SST driver 30 of the transmitter circuit 14B takes a value equivalent to the resistance value of the combined resistances of the output resistor 35, the high potential side resistor 37H, and the low potential side resistor 37L connected in parallel to each other. For example, when the output impedance of the SST driver 30 is set to 50Ω, the resistance values of each of the resistors are set such that the resistance value of the combined resistance of the output resistor 35, the high potential side resistor 37H, and the low potential side resistor 37L connected in parallel to each other, is 50Ω. Similarly, when output impedance of the SST driver 40 is set to 50Ω, the resistance values of each of the resistors are set such that the resistance value of the combined resistance of the output resistor 45, the high potential side resistor 47H, and the low potential side resistor 47L connected in parallel to each other, is 50Ω.

However, the resistance values of the output resistors 35, 45, the high potential side resistors 37H, 47H, and the low potential side resistors 37L, 47L configured by the semiconductor vary depending on PVT. Accordingly, there is a concern that one or both out of the magnitude of the output amplitude and the resistance value of the output impedance in the transmitter circuit 14B may deviate from their specifications when the resistance value of each of the resistors varies with PVT.

Figure 5:
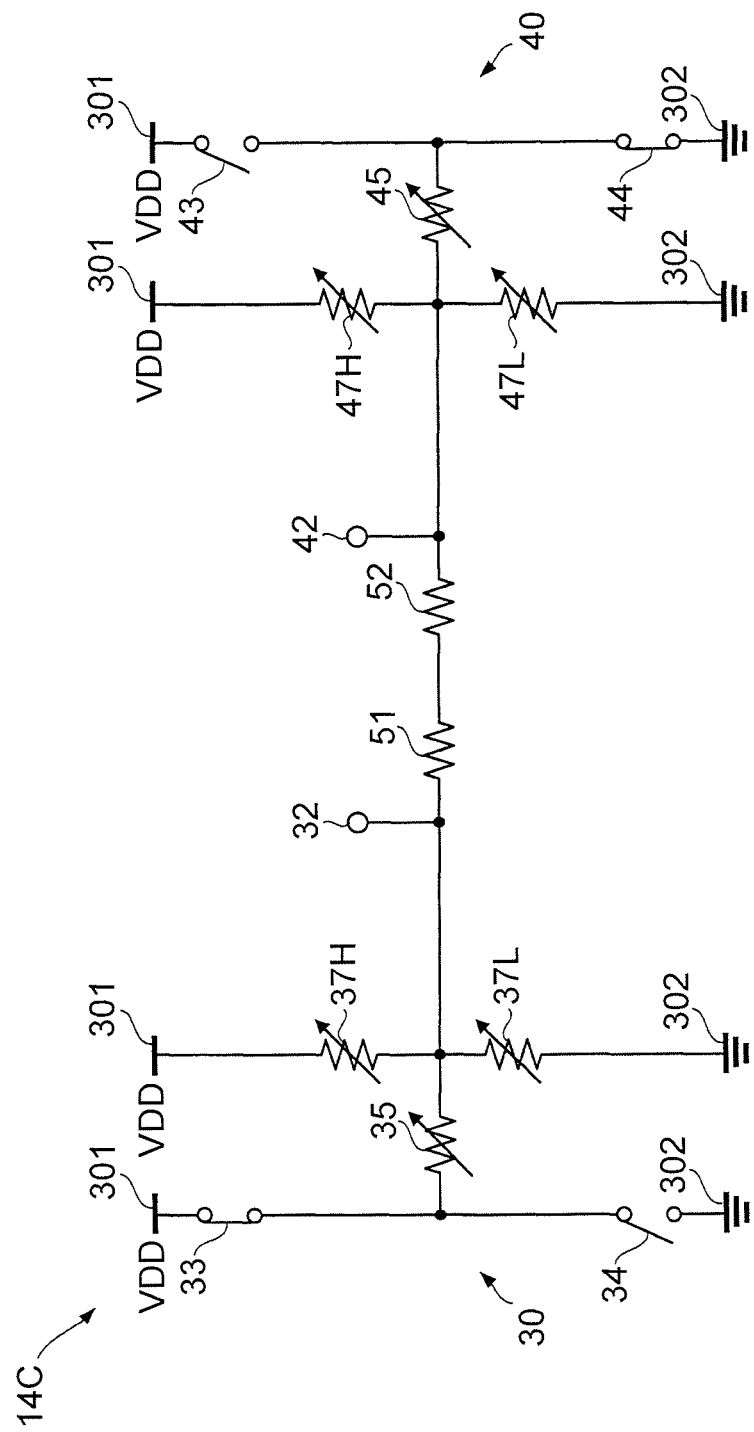
FIG. 5 is a model diagram illustrating a configuration of a transmitter circuit according to a third comparative example.

FIG. 5 is a diagram illustrating a transmitter circuit 14C according to a third comparative example in a similar format to FIG. 3 and FIG. 4. In FIG. 5, the same reference numerals are allocated to configuration elements the same as, or corresponding to, those of the transmitter circuit 14A according to the first comparative example and the transmitter circuit 14B according to the second comparative example, and duplicate explanation thereof is omitted.

The transmitter circuit 14C according to the third comparative example differs from the transmitter circuit 14B according to the second comparative example in that the output resistors 35, 45, the high potential side resistors 37H, 47H, and the low potential side resistors 37L, 47L are all configured as variable resistors. According to the transmitter circuit 14C, the resistance value of each of the resistors can be adjusted even when the resistance values of the output resistors 35, 45, the high potential side resistors 37H, 47H, and the low potential side resistors 37L, 47L vary with PVT. Variation in the output amplitude and output impedance accompanying resistance value variations can accordingly be suppressed.

Figure 9:
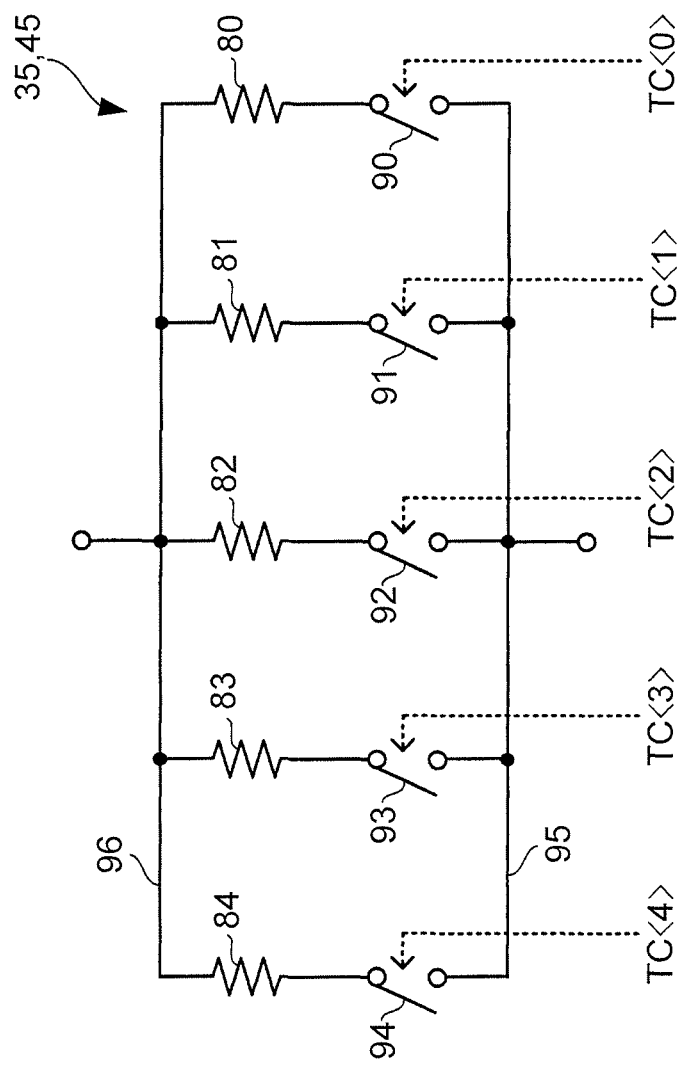
FIG. 9 is a diagram illustrating an example of a configuration of a variable resistor circuit that configures an output resistor according to an exemplary embodiment of technology disclosed herein.

However, the circuit surface area becomes very large when the output resistors 35, 45, the high potential side resistors 37H, 47H, and the low potential side resistors 37L, 47L are all configured as variable resistor circuits having plural resistor elements and switches, as illustrated in FIG. 9, for example. Moreover, the number and length of the wires connected to the output terminals 32, 42 increase. As a result, there is a concern that parasitic resistances and parasitic capacitances connected to the output terminals 32, 42 will increase, and the output amplitude will decrease at high frequencies.

Figure 6:
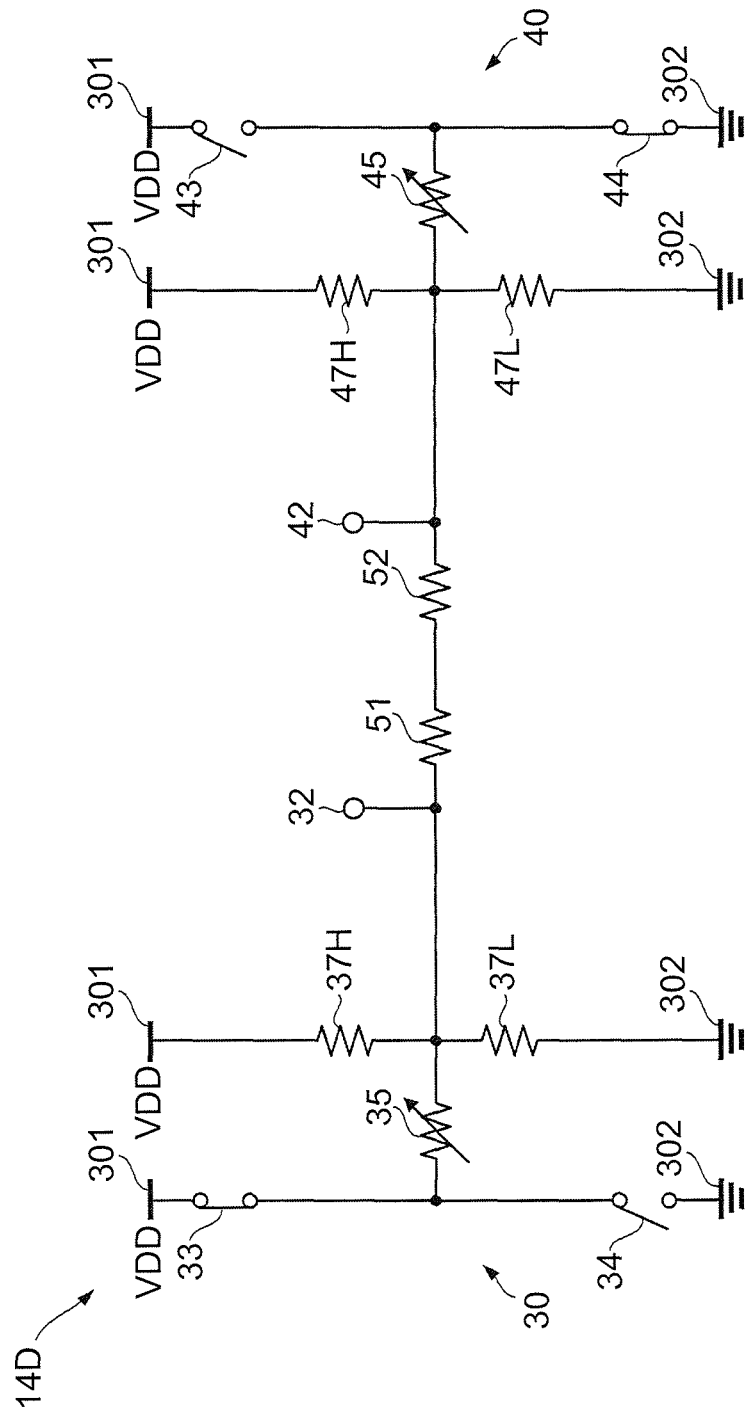
FIG. 6 is a model diagram illustrating a configuration of a transmitter circuit according to a fourth comparative example.

FIG. 6 is a diagram illustrating a transmitter circuit 14D according to a fourth comparative example in a similar format to FIG. 3 to FIG. 5. In FIG. 6, the same reference numerals are allocated to configuration elements the same as, or corresponding to, those of the transmitter circuits 14A, 14B and 14C according to the first to third comparative examples, and duplicate explanation thereof is omitted.

The transmitter circuit 14D according to the fourth comparative example differs from the transmitter circuit 14C according to the third comparative example in that the output resistors 35, 45 are configured as variable resistors, and the high potential side resistors 37H, 47H and the low potential side resistors 37L, 47L are configured as fixed resistors. According to the transmitter circuit 14D, the parasitic resistances and the parasitic capacitances connected to the output terminals 32, 42 can be made smaller than in the transmitter circuit 14C since the number of wires connected to the output terminals 32, 42 can be reduced compared to the transmitter circuit 14C.

According to the transmitter circuit 14D, the output impedance can be kept within the specification range by adjusting the resistance values of the output resistors 35, 45, even when the output resistors 35, 45, the high potential side resistors 37H, 47H, and the low potential side resistors 37L, 47L vary with PVT. However, there is a concern that magnitude of the output amplitude may deviate from the specification since the resistance values of the high potential side resistors 37H, 47H and the low potential side resistors 37L, 47L are not adjustable.

For example, when the resistance values of the high potential side resistor 37H and the low potential side resistor 37L are both set to 200Ω, and the output impedance of the SST driver 30 is set to 50Ω, the resistance value of the output resistor 35 is adjusted to 100Ω. When the resistance values of the high potential side resistor 37H and the low potential side resistor 37L vary to, for example, 150Ω with PVT, the output impedance of the SST driver 30 can be set to 50Ω by adjusting the resistance value of the output resistor 35 to 150Ω. The former case, (when the resistance values of the high potential side resistor 37H and the low potential side resistor 37L are both 200Ω) and the latter case (when the resistance values of the high potential side resistor 37H and the low potential side resistor 37L are both 150Ω) have different output amplitudes since the ratios between the resistance value of the output resistor 35 and the resistance values of the high potential side resistor 37H and low potential side resistor 37L are different. More specifically, the output amplitude is greater in the former case than in the latter case.

Thus, there is a concern that the magnitude of the output amplitude may deviate from the specification when the resistance values of each of the resistors in the transmitter circuit 14D varies with PVT, even though the resistance value of the output impedance can be adjusted to be within the specification range. Namely, there is a concern that it may become difficult to satisfy both the specification of the output impedance and the specification of the output amplitude simultaneously in the transmitter circuit 14D according to the fourth comparative example.

Figure 7:
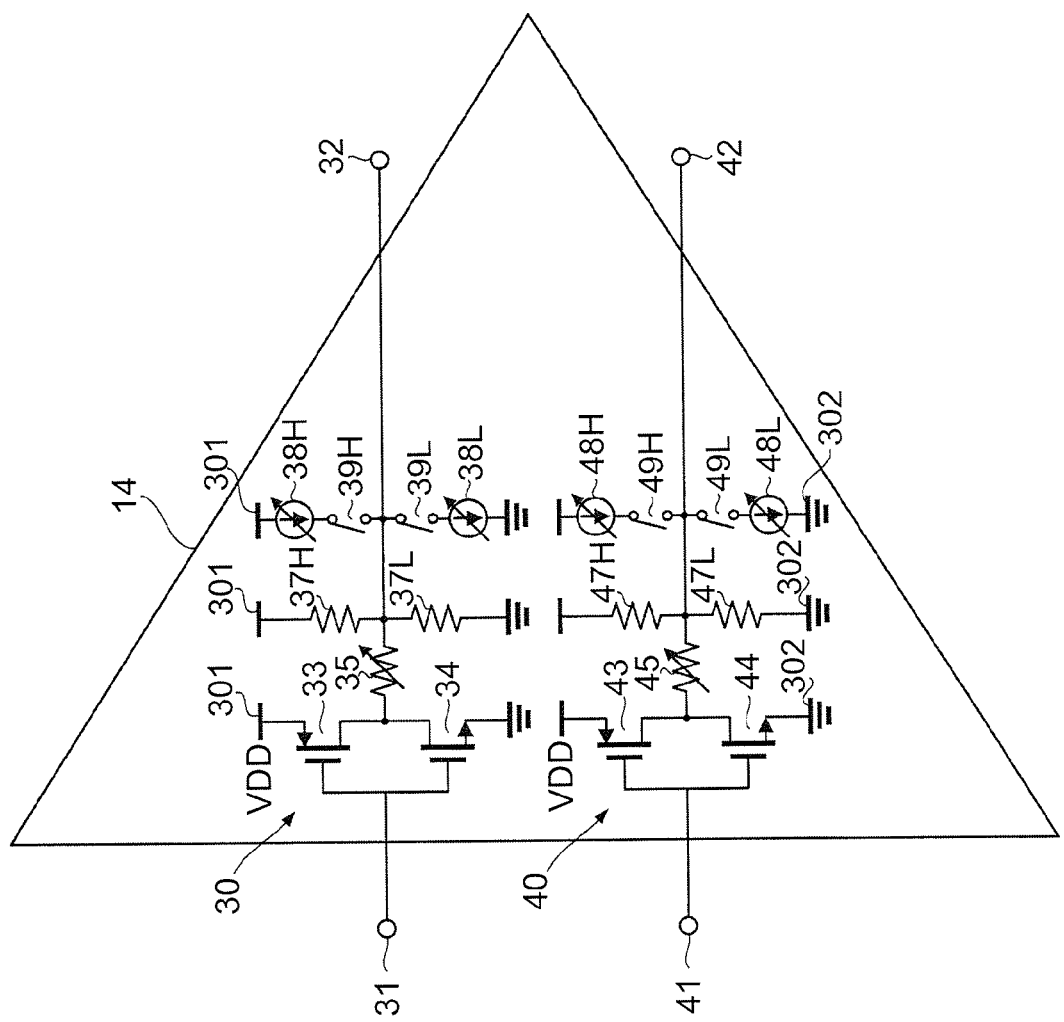
FIG. 7 is a circuit diagram illustrating a configuration of a transmitter circuit according to an exemplary embodiment of technology disclosed herein.

FIG. 7 is a circuit diagram illustrating a configuration of a transmitter circuit 14 according to an exemplary embodiment of technology disclosed herein. In FIG. 7, the same reference numerals are allocated to configuration elements the same as, or corresponding to, those of the transmitter circuits 14A, 14B, 14C, and 14D according to the first to fourth comparative examples, and duplicate explanation thereof is omitted.

Similarly to the transmitter circuit 14D according to the fourth comparative example, in the transmitter circuit 14, the output resistor 35 of the non-inverted phase side SST driver 30 and the output resistor 45 of the inverted phase side SST driver 40 are configured as variable resistors. Also similarly to the transmitter circuit 14D according to the fourth comparative example, the high potential side resistors 37H, 47H and the low potential side resistors 37L, 47L of the transmitter circuit 14 are configured as fixed resistors.

On the non-inverted phase side, the transmitter circuit 14 includes a high potential side current source 38H and high potential side switch 39H provided between the high potential line 301 and the output terminal 32, and a low potential side current source 38L and low potential side switch 39L provided between the low potential line 302 and the output terminal 32. On the inverted phase side, the transmitter circuit 14 includes a high potential side current source 48H and high potential side switch 49H provided between the high potential line 301 and the output terminal 42, and a low potential side current source 48L and low potential side switch 49L provided between the low potential line 302 and the output terminal 42. Note that the positional relationship between the high potential side current source 38H and the high potential side switch 39H may be inverted. The same applies for the high potential side current source 48H and the high potential side switch 49H, the low potential side current source 38L and the low potential side switch 39L, and the low potential side current source 48L and the low potential side switch 49L.

Figure 8:
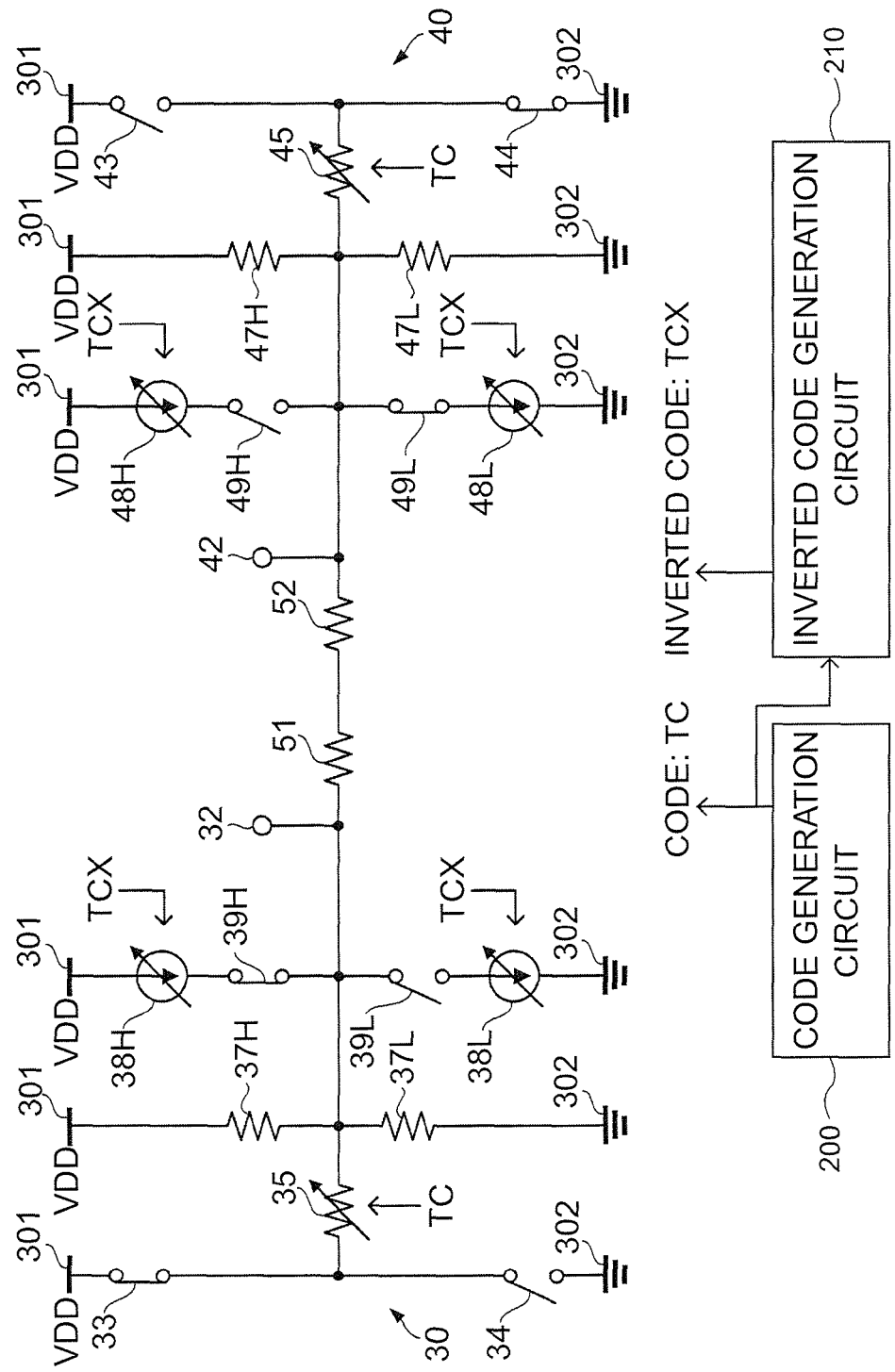
FIG. 8 is a model diagram illustrating a configuration of a transmitter circuit according to an exemplary embodiment of technology disclosed herein.

FIG. 8 is a diagram illustrating the transmitter circuit 14 in a similar format to FIG. 3 to FIG. 6. In the transmitter circuit 14, the output resistors 35, 45 are configured by variable resistor circuits, and the resistance values of the output resistors 35, 45 are set by a resistance value setting code TC supplied from a code generation circuit 200 provided inside, or externally to, the transmitter circuit 14. The resistance values of the output resistors 35, 45 may be set to the same value as each other.

FIG. 9 is a diagram illustrating an example of a configuration of a variable resistor circuit configuring the output resistors 35, 45. The output resistors 35, 45 include plural resistor elements 80, 81, 82, 83, and 84. Each of the resistor elements 80, 81, 82, 83, and 84 has one end connected to a common connection line 95 through switches 90, 91, 92, 93, and 94, respectively. The other ends of the resistor elements 80, 81, 82, 83, and 84 are connected to a common connection line 96.

The resistor elements 80, 81, 82, 83, and 84 have mutually different resistance values. In the present exemplary embodiment, the resistance value of the resistor element 84 is set to $R_{LSB}$, the resistance value of the resistor element 83 is set to $2 R_{LSB}$, the resistance value of the resistor element 82 is set to $4 R_{LSB}$, the resistance value of the resistor element 81 is set to $8 R_{LSB}$, and the resistance value of the resistor element 80 is set to $16 R_{LSB}$. The resistor elements 80 to 84 may each be configured by a single resistor element, or may be configured including plural resistor element units having a specific resistance value.

The switches 90, 91, 92, 93, and 94 each switch ON and OFF based on a corresponding bit value in the 5-bit resistance value setting code TC supplied from the code generation circuit 200. Namely, the switch 90 assumes an OFF state when the value of the least significant bit TC<0> of the resistance value setting code TC is "0", and assumes an ON state when TC<0> is "1". The switch 91 assumes an OFF state when the value of the second bit TC<1> of the resistance value setting code TC is "0", and assumes an ON state when TC<1> is "1". The switch 92 assumes an OFF state when the value of the third bit TC<2> of the resistance value setting code TC is "0", and assumes an ON state when TC<2> is "1". The switch 93 assumes an OFF state when the value of the fourth bit TC<3> of the resistance value setting code TC is "0", and assumes an ON state when TC<3> is "1". The switch 94 assumes an OFF state when the value of the most significant bit TC<4> of the resistance value setting code TC is "0", and assumes an ON state when TC<4> is "1".

The resistance values of the output resistors 35, 45 can be set to the desired values by selecting the switches out of the switches 90, 91, 92, 93, and 94 that are to assume the ON state using the resistance value setting code TC. According to the variable resistor circuit having the above configuration, the resistance values of the output resistors 35, 45 are inversely proportional to the values of the resistance value setting code TC.

Note that the number of resistor elements in the variable resistor circuits configuring the output resistors 35, 45, and the number of bits in the resistance value setting code TC, may be increased or decreased as appropriate. The adjustable range of the resistance values of the output resistors 35, 45 can be broadened, and the adjustment resolution of the resistance values can be increased, by increasing the number of resistor elements in the variable resistor circuits, and the number of bits in the resistance value setting code TC. Moreover, although the variable resistor circuits according to the present exemplary embodiment have a configuration in which the resistance value is changed by changing the combination of resistor elements that are connected in parallel, the variable resistor circuits may be configured such that the resistance value can be changed by changing a combination of resistor elements that are connected in series.

The high potential side current sources 38H, 48H, and the low potential side current sources 38L, 48L are circuits that output a current having a magnitude according to an inverted code TCX supplied from an inverted code generation circuit 210 provided inside, or externally to, the transmitter circuit 14. The inverted code TCX is a code in which each bit value of the resistance value setting code TC generated by the code generation circuit 200 is inverted. Note that in the present exemplary embodiment, the output currents of the high potential side current sources 38H, 48H and the low potential side current sources 38L, 48L are set to the same magnitudes as each other.

Figure 10:
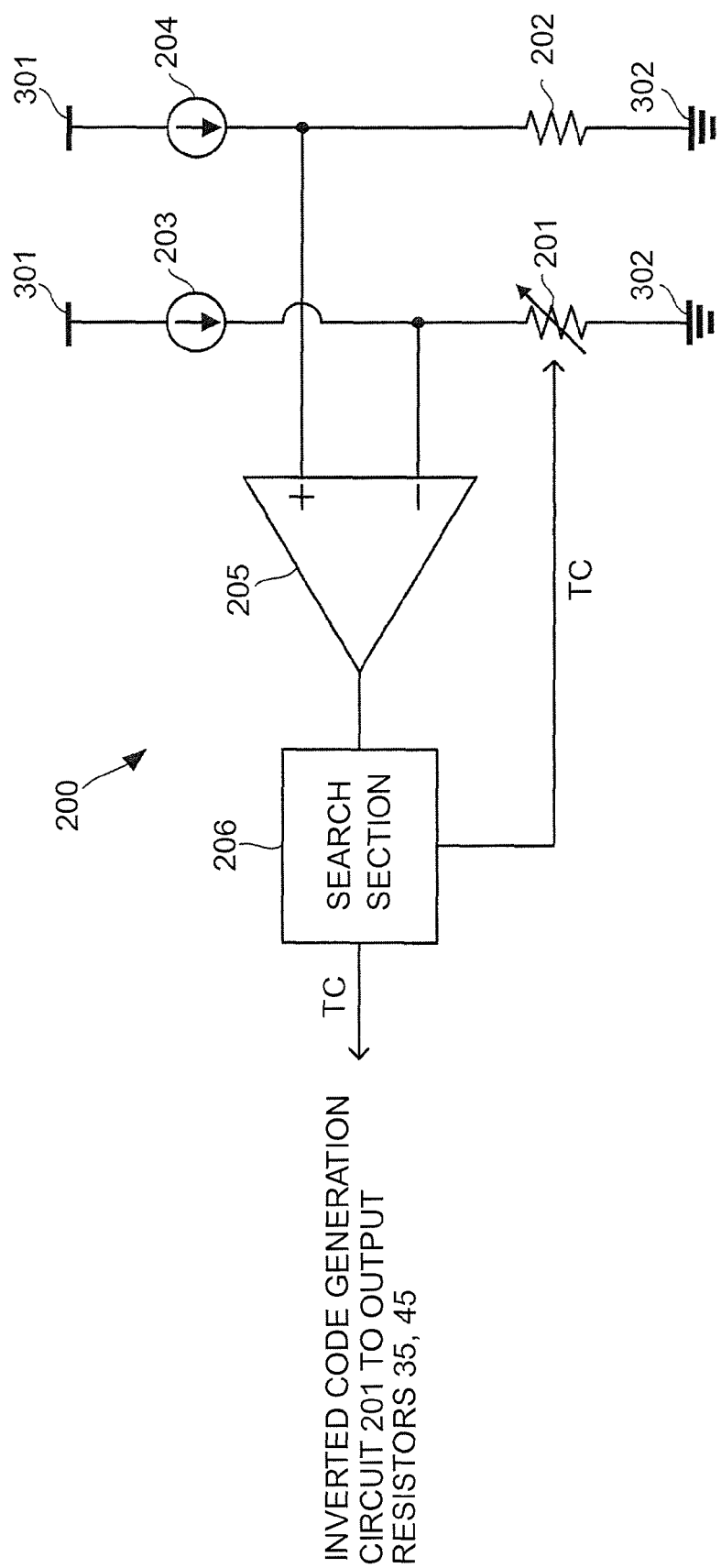
FIG. 10 is a diagram illustrating an example of a configuration of a code generating circuit according to an exemplary embodiment of technology disclosed herein.

FIG. 10 is a diagram illustrating an example of a configuration of the code generation circuit 200. The code generation circuit 200 includes a duplicating resistor 201, a reference resistor 202, a current source 203 that supplies current of a specific magnitude to the duplicating resistor 201, and a current source 204 that supplies current of a specific magnitude to the reference resistor 202. Moreover, the code generation circuit 200 includes a comparator 205 with an inverted input terminal connected to the duplicating resistor 201 and a non-inverted input terminal connected to the reference resistor 202, and a search section 206 connected to an output terminal of the comparator 205.

The duplicating resistor 201 is a resistor configured, for example, to duplicate the output resistor 35, the high potential side resistor 37H, and the low potential side resistor 37L of the SST driver 30 so as to give a connection state similar to that of the SST driver 30. The portion of the duplicating resistor 201 corresponding to the output resistor 35 is configured as the variable resistor circuit illustrated in FIG. 9, with one end, for example, connected to the low potential line 302 or the current source 203.

The reference resistor 202 is, for example, a resistor device having a resistance value equivalent to a center value (for example, 50Ω) of the specification output impedance of the transmitter circuit 14. The reference resistor 202 may be configured as separate body from the semiconductor integrated circuit 10, or may be mounted to the printed substrate to which the semiconductor integrated circuit 10 is mounted.

The reference resistor 202 is preferably a resistor device having a relatively small temperature coefficient, such as a metal film resistor.

Explanation follows regarding a procedure by which the code generation circuit 200 generates the resistance value setting code TC. Generation of the resistance value setting code TC by the code generation circuit 200 is, for example, performed as part of a calibration executed after introduction of a power source of the semiconductor integrated circuit 10. When the power source of the semiconductor integrated circuit 10 is introduced, the search section 206 sets the resistance value of the duplicating resistor 201 to the maximum value, this being an initial value, by supplying an initial value of the resistance value setting code TC to the duplicating resistor 201. Currents of equivalent magnitude are then output from the current sources 203 and 204, and supplied to the duplicating resistor 201 and the reference resistor 202.

The comparator 205 compares the magnitude of the terminal voltage of the duplicating resistor 201 input to the inverted input terminal, against the magnitude of the terminal voltage of the reference resistor 202 input to the non-inverted input terminal. The comparator 205 outputs a high level output signal from the output terminal when the terminal voltage of the duplicating resistor 201 is smaller than the terminal voltage of the reference resistor 202, and outputs a low level output signal from the output terminal in the converse case. Namely, the resistance value of the duplicating resistor 201 is compared against the resistance value of the reference resistor 202 by the comparator 205. The result of the comparison by the comparator 205 is supplied to the search section 206.

The search section 206 finds the point at which the output of the comparator 205 transitions from low level to high level by sequentially increasing the value of the resistance value setting code TC and sequentially decreasing the resistance value of the duplicating resistor 201. The search section 206 thereby derives the resistance value setting code TC at which the resistance value of the duplicating resistor 201 is closest to the resistance value of the reference resistor 202. A known binary searching method may be employed when finding the point at which the output of the comparator 205 transitions from low level to high level. The search section 206 supplies the derived resistance value setting code TC to the variable resistor circuits (see FIG. 9) that configure the output resistors 35, 45. The resistance values of the output impedance of the SST drivers 30 and 40 are thereby adjusted to substantially the same value as the resistance value of the reference resistor 202.

The search section 206 also supplies the derived resistance value setting code TC to the inverted code generation circuit 210. The inverted code generation circuit 210 generates an inverted code TCX in which the value of each bit of the resistance value setting code TC supplied from the code generation circuit 200 is inverted, and supplies the inverted code TCX to the high potential side current sources 38H, 48H and the low potential side current sources 38L, 48L.

Figure 11:
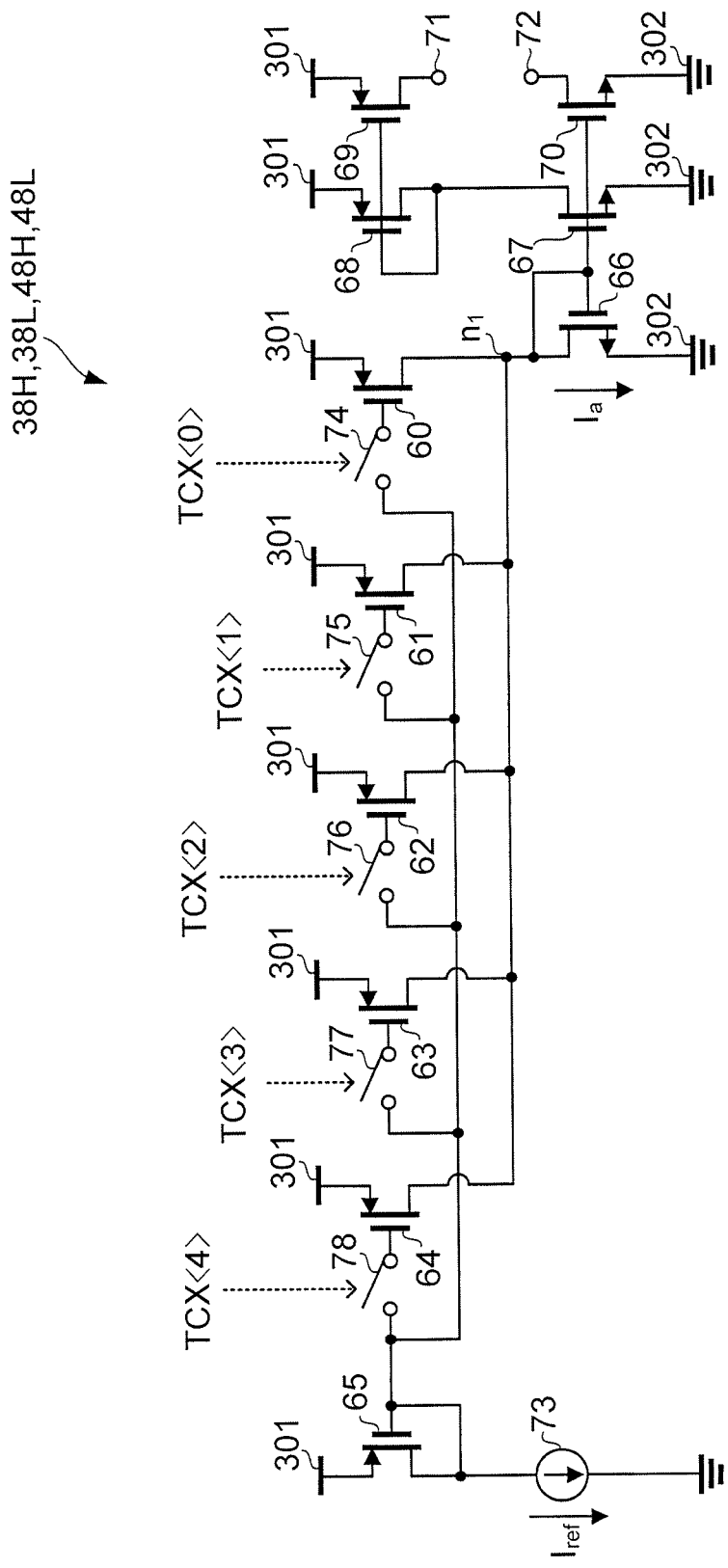
FIG. 11 is a diagram illustrating an example of a configuration of a high potential side current source and a low potential side current source according to an exemplary embodiment of technology disclosed herein.

FIG. 11 is a diagram illustrating an example of a configuration of the high potential side current sources 38H, 48H and the low potential side current sources 38L, 48L. The high potential side current sources 38H, 48H and the low potential side current sources 38L, 48L are configured including what are known as current mirroring circuits, and include a reference current source 73 that generates a reference current $I_{ref}$ and a P-MOS transistor 65 connected to the reference current source 73. The source of the P-MOS transistor 65 is connected to the high potential line 301, and the drain of the P-MOS transistor 65 is connected to the reference current source 73. The gate of the P-MOS transistor 65 is connected to the drain of the P-MOS transistor 65 itself, and to one end of each of respective switches 74, 75, 76, 77, and 78. The other ends of the switches 74, 75, 76, 77, and 78 are connected to the gates of corresponding P-MOS transistors 60, 61, 62, 63, and 64, respectively. The sources of the P-MOS transistors 60, 61, 62, 63, and 64 are each connected to the high potential line 301, and the drains are each connected to a node $n_1$.

In the present exemplary embodiment, the width of the gate of the P-MOS transistor 60 is W, and the width of the gate of the P-MOS transistor 61 is 2 W. The width of the gate of the P-MOS transistor 62 is 4 W, the width of the gate of the P-MOS transistor 63 is 8 W, and the width of the gate of the P-MOS transistor 64 is 16 W. Namely, the P-MOS transistor 61 outputs a current having twice the magnitude of that of the P-MOS transistor 60, and the P-MOS transistor 62 outputs a current having four times the magnitude of that of the P-MOS transistor 60. The P-MOS transistor 63 outputs a current having 8 times the magnitude of that of the P-MOS transistor 60, and the P-MOS transistor 64 outputs a current having 16 times the magnitude of that of the P-MOS transistor 60.

The drain of an N-MOS transistor 66 is connected to the node $n_1$, the source is connected to the low potential line 302, and the gate is connected to the drain of the N-MOS transistor 66 itself (namely, to node $n_1$) and to the gates of N-MOS transistors 67 and 70. The source of the N-MOS transistor 67 is connected to the low potential line 302, and the drain is connected to the drain of a P-MOS transistor 68. The source of the P-MOS transistor 68 is connected to the high potential line 301, and the gate is connected to the drain of the P-MOS transistor 68 itself and to the gate of a P-MOS transistor 69.

The source of the P-MOS transistor 69 is connected to the high potential line 301. The drain 71 of the P-MOS transistor 69 corresponds to the output terminals of the high potential side current sources 38H and 48H. The source of the N-MOS transistor 70 is connected to the low potential line 302. The drain 72 of the N-MOS transistor 70 corresponds to the output terminals of the low potential side current sources 38L and 48L.

The switches 74, 75, 76, 77, and 78 are each switched ON and OFF based on respective corresponding bit values in the 5-bit inverted code TCX supplied from the inverted code generation circuit 210. Namely, the switch 74 assumes an OFF state when the value of the least significant bit TCX<0> of the inverted code TCX is "0", and assumes an ON state when TCX<0> is "1". The switch 75 assumes an OFF state when the value of the second bit TCX<1> of the inverted code TCX is "0", and assumes an ON state when TCX<1> is "1". The switch 76 assumes an OFF state when the value of the third bit TCX<2> of the inverted code TCX is "0", and assumes an ON state when TCX<2> is "1". The switch 77 assumes an OFF state when the value of the fourth bit TCX<3> of the inverted code TCX is "0", and assumes an ON state when TCX<3> is "1". The switch 78 assumes an OFF state when the value of the most significant bit TCX<4> of the inverted code TCX is "0", and assumes an ON state when TCX<4> is "1".

The P-MOS transistors 60, 61, 62, 63, and 64 selectively assume the ON state due to the switches 74, 75, 76, 77, and 78 selectively assuming the ON state. The current output from each of the P-MOS transistors in the ON state out of the P-MOS transistors 60, 61, 62, 63, and 64 converge at the node $n_1$, and flow to the N-MOS transistor 66. The P-MOS transistor 69 and the N-MOS transistor 70 output a current having a magnitude equal to a current $I_a$ flowing into the N-MOS transistor 66.

The magnitudes of the output current of the high potential side current sources 38H, 48H and the low potential side current sources 38L, 48L are proportional to the value of the inverted code TCX due to the high potential side current sources 38H, 48H and the low potential side current sources 38L, 48L being configured as described above. In other words, the magnitudes of the output current of the high potential side current sources 38H, 48H and the low potential side current sources 38L, 48L are negatively correlated with the value of the resistance value setting code TC. According to the circuit configuration illustrated in FIG. 11, the reference current source 73, the P-MOS transistor 65, the switches 74 to 78, and the P-MOS transistors 60 to 64 are the circuit portions that determine the magnitude of each output current of the current sources 38H, 38L, 48H, 48L, and these circuit portions are shared by each of the current sources 38H, 38L, 48H, and 48L. The circuit scale can thereby be reduced compared to cases in which the circuit portions mentioned above are provided each of the current sources 38H, 38L, 48H, and 48L individually.

The high potential side switches 39H, 49H and the low potential side switches 39L, 49L are switched ON and OFF coupled with switching the switches 33, 34 of the SST driver 30, and the switches 43, 44 of the SST driver 40 ON and OFF. Namely, as illustrated in FIG. 8, when the switch 33 of the SST driver 30 assumes the ON state (at this time, the switches 34 and 43 are in the OFF state, the switch 44 is in the ON state, a high level output signal is output from the SST driver 30, and a low level output signal is output from the SST driver 40), control is performed such that the high potential side switch 39H and the low potential side switch 49L assume the ON state, and the low potential side switch 39L and the high potential side switch 49H assume the OFF state. When the switch 33 of the SST driver 30 is in the OFF state (at this time, the switches 34 and 43 are in the ON state, the switch 44 is in the OFF state, a low level output signal is output from the SST driver 30, and a high level output signal is output from the SST driver 40), control is made such that the high potential side switch 39H and the low potential side switch 49L assume the OFF state, and the low potential side switch 39L and the high potential side switch 49H assume the ON state.

As illustrated in FIG. 8, the current output from the high potential side current source 38H flows to the low potential side resistor 37L and to the input resistors 51 and 52 of the receiver circuit when the switches 33, 39H, 44, and 49L are in the ON state, and the switches 34, 39L, 43, and 49H are in the OFF state. In such cases, current flowing through the high potential side resistor 47H from the high potential line 301 and current flowing through the input resistors 51, 52 is drawn into the low potential line 302 by the low potential side current source 48L. When in a state logically inverted compared to the state illustrated in FIG. 8 (namely, when the switches 33, 39H, 44, and 49L are in the OFF state, and the switches 34, 39L, 43, and 49H are in the ON state), current output from the high potential side current source 48H flows into the low potential side resistor 47L and the input resistors 51 and 52. In such cases, current flowing through the high potential side resistor 37H from the high potential line 30 and current flowing through the input resistors 51 and 52, is drawn into the low potential line 302 by the low potential side current source 38L.

Performing current supply using the high potential side current sources 38H, 48H, and the low potential side current sources 38L, 48L as described above enables the output amplitude of the transmitter circuit 14 to be made large compared to cases lacking the current supply. The increasing effect on the output amplitude by the high potential side current sources 38H, 48H and the low potential side current sources 38L, 48L is larger the larger the output current of these current sources.

Explanation follows regarding operation of the transmitter circuit 14 according to the present exemplary embodiment. The code generation circuit 200 derives the resistance value setting code TC during calibration performed after current source input, and supplies the derived resistance value setting code TC to the output resistors 35, 45. The resistance values of the output resistors 35, 45 are thereby adjusted such that the output impedance of the SST drivers 30 and 40 is a specific value (for example, 50Ω).

The value of the resistance value setting code TC is smaller, and the resistance values of the output resistors 35, 45 are larger, the smaller the resistance values of the high potential side resistors 37H, 47H and the low potential side resistors 37L, 47L that vary with PVT. In the transmitter circuit 14D according to the comparative example, the output amplitude is smaller the smaller the resistance values of the high potential side resistors 37H, 47H and the low potential side resistors 37L, 47L. However, in the transmitter circuit 14 according to the present exemplary embodiment, the output currents of the high potential side current sources 38H, 48H and the low potential side current sources 38L, 48L are larger the smaller the value of the resistance value setting code TC, thereby enlarging the increasing effect of these current sources on the output amplitude.

In this manner, in the transmitter circuit 14 according to the present exemplary embodiment, the increasing effect on the output amplitude by the high potential side current sources 38H, 48H and the low potential side current sources 38L, 48L is greater the smaller the resistance values of the high potential side resistors 37H, 47H and the low potential side resistors 37L, 47L (namely, the greater the resistance values of the output resistors 35, 45 set according to the resistance value setting code TC). Accordingly, variation in the output amplitude accompanying resistance value variation with PVT is compensated for by the high potential side current sources 38H, 48H and the low potential side current sources 38L, 48L. An advantageous effect of compensating for output amplitude variation accompanying resistance value variation can be obtained by setting the current values of the high potential side current sources 38H, 48H and the low potential side current sources 38L, 48L so as to increase in conjunction with the resistance values of the output resistors 35, 45 set according to the resistance value setting code TC. The transmitter circuit 14 according to the present exemplary embodiment obtains the compensation effect by outputting, to the high potential side current sources 38H, 48H and the low potential side current sources 38L, 48L, a current having a magnitude proportional to the value of the inverted code TCX in which the value of each bit in the resistance value setting code TC is inverted. In the transmitter circuit 14 according to the present exemplary embodiment, the fluctuation width in the output amplitude can be made small compared to the transmitter circuit 14D according to the comparative example that lacks functionality to compensate for output amplitude variation.

The output amplitude A in the transmitter circuit 14D according to the fourth comparative example that lacks the high potential side current sources 38H, 48H and the low potential side current sources 38L, 48L (see FIG. 6) is indicated by Equation (1) below. The output amplitude A is taken as the peak-to-peak value of differential voltage, this being the difference ($V_{OUTP}$–$V_{OUTN}$) between an output voltage $V_{OUTP}$ generated at the non-inverted phase side output terminal 32 and an output voltage $V_{OUTN}$ generated at the inverted phase side output terminal 42.

$$A = VDD \times 50\Omega \times tc/R_{LSB} = VDD \times tc/(tc+k_a) \tag{1}$$

Herein, tc is the value of the resistance value setting code TC expressed as a decimal. The resistance values of the output resistors 35, 45 are inversely proportional to tc. $R_{LSB}$ is the resistance value of the resistor element 84, which has the smallest resistance value out of the resistor elements 80 to 84 in the variable resistor circuit that configures the output resistors 35, 45 (see FIG. 9), and $R_{LSB}$ varies by approximately ±20% with PVT. Moreover, $k_a$ is a constant value that does not vary with PVT. Equation (2) below is established when the resistance values of the high potential side resistors 37H, 47H and the low potential side resistors 37L, 47L are taken as $R_a$.

$$R_a = (2/k_a) \times R_{LSB} \tag{2}$$

The output impedance of the SST drivers 30, 40, and the input resistors 51, 52 of the receiver circuit 17A are each adjusted to 50Ω.

As indicated by Equation (1), the output amplitude A of the transmitter circuit 14D according to the comparative example has a positive correlation with tc. The output amplitude A is substantially proportional to tc when $k_a \gg tc$. Namely, in the transmitter circuit 14D according to the comparative example, the magnitude of the output amplitude sometimes deviates from the specification due to the value of the resistance value setting code TC, since the output amplitude increases and decreases according to the value of the resistance value setting code TC.

However, the output amplitude A of the transmitter circuit 14 according to the exemplary embodiment of technology disclosed herein is expressed by Equation (3) below.

$$A = VDD \times tc/(tc+k_a) + I_O \times 100\Omega \times tcx \tag{3}$$

Herein, $I_O$ is the value of the current output from the P-MOS transistor 60 having the smallest gate width out of the P-MOS transistors 60 to 64 that configure the high potential side current sources 38H, 48H and the low potential side current sources 38L, 48L (see FIG. 11). Moreover, tcx is the value of the inverted code TCX expressed as a decimal.

The first term on the right side of Equation (3) has a positive correlation with tc. However, the second term on the right side of Equation (3) has a negative correlation with tc. Thus in the transmitter circuit 14 according to the present exemplary embodiment, the output amplitude A includes an element that exhibits positive correlation, and an element that exhibits negative correlation, with the value tc of the resistance value setting code TC, such that these effects cancel out. Accordingly, the fluctuation width in the output amplitude that varies with the value tc of the resistance value setting code TC can be made smaller than in the transmitter circuit 14D according to the comparative example.

Figure 12:
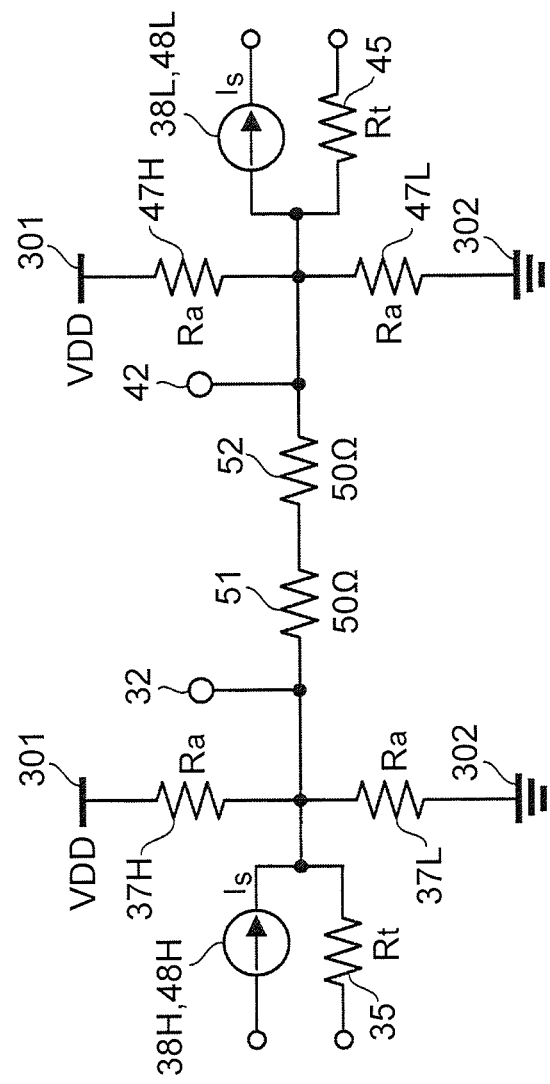
FIG. 12 is a model diagram of a transmitter circuit according to an exemplary embodiment of technology disclosed herein.

Explanation follows regarding the process for deriving Equation (3). FIG. 12 is a simplified model diagram of the transmitter circuit 14. In the model illustrated in FIG. 12, the resistance values of the input resistors 51 and 52 of the receiver circuit 17A are each 50Ω, the resistance values of the output resistors 35, 45 are each $R_t$, and the resistance values of the high potential side resistors 37H, 47H and the low potential side resistors 37L, 47L are each $R_a$. The output currents of the high potential side current sources 38H, 48H and the low potential side current sources 38L, 48L are each $I_s$. In the model illustrated in FIG. 12, inductive resistance and current source saturation are ignored.

Figure 13:
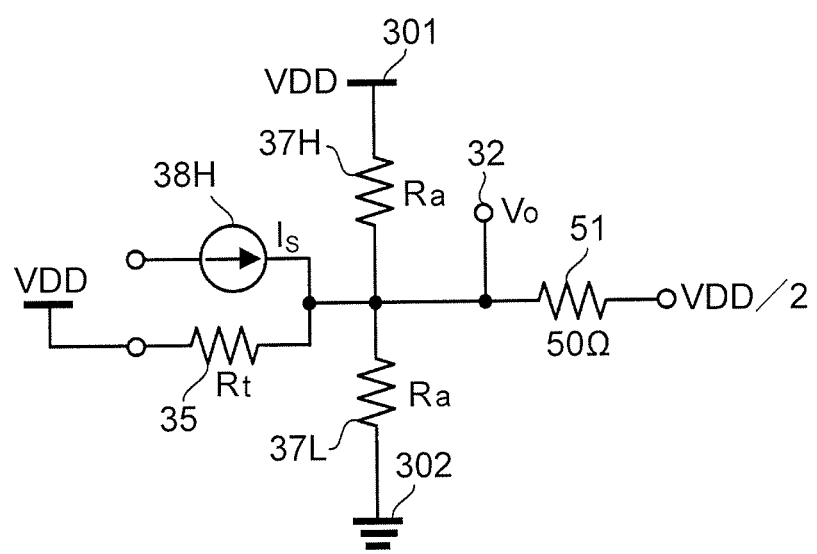
FIG. 13 is a model diagram of a transmitter circuit according to an exemplary embodiment of technology disclosed herein.

The transmitter circuit 14 is a differential circuit that can considered as half circuits as illustrated in FIG. 13, since the non-inverted phase side is symmetrical with the inverted phase side. The voltage of the center point of the differential is always VDD/2. In the model illustrated in FIG. 13, the output voltage $V_O$ generated at the output terminal 32 is found.

When finding the output voltage $V_O$, the calculation is made simple when the admittance of each resistor is employed. When the admittance of the output resistor 35 is $G_t$, the admittance of the high potential side resistors 37H and the low potential side resistor 37L is $G_a$, and the admittance of the input resistor 51 having a resistance value of 50Ω is $G_{50}$, Equation (4) to Equation (6) below are established for $G_t$, $G_a$, and $G_{50}$.

$$G_t = 1/R_t \tag{4}$$

$$G_a = 1/R_a \tag{5}$$

$$G_{50} = 20 \text{ mS} \tag{6}$$

The output voltage $V_O$ can be computed using superposition theorem. Namely, in the states illustrated in FIG. 14A, FIG. 14B, and FIG. 14C, respectively, the output voltage $V_O$ can be found by finding and summing output voltages $V_{O1}$, $V_{O2}$, and $V_{O3}$ generated at the output terminal 32.

Figure 14A:
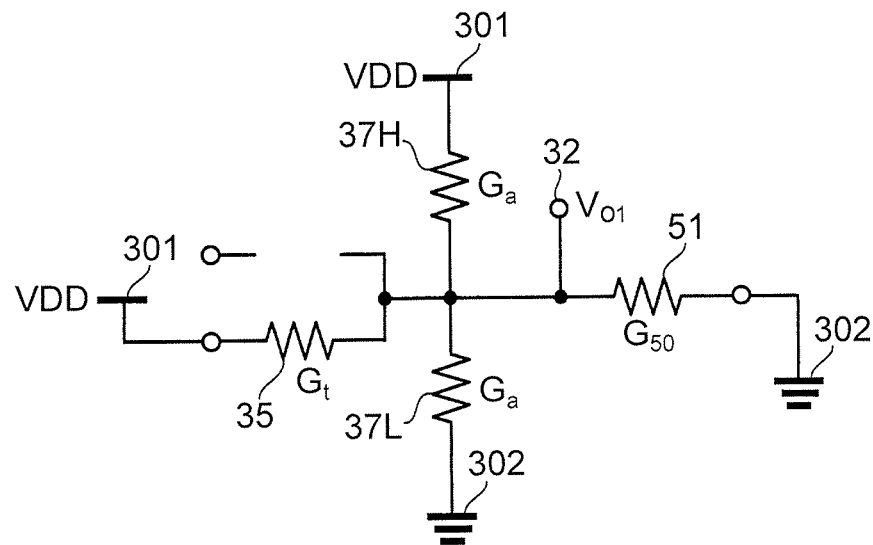
FIG. 14A is a model diagram of a transmitter circuit according to an exemplary embodiment of technology disclosed herein.

FIG. 14A is a model diagram of a case that computes the output voltage $V_{O1}$ generated at the output terminal 32 by the power source voltage VDD. In this model, the high potential side current source 38H is in an open state, and the center point of the differential is short circuited to the low potential line 302. The output voltage $V_{O1}$ is expressed by Equation (7) below.

$$V_{O1} = VDD(G_t + G_a)/(G_t + 2G_a + G_{50}) \tag{7}$$

Figure 14B:
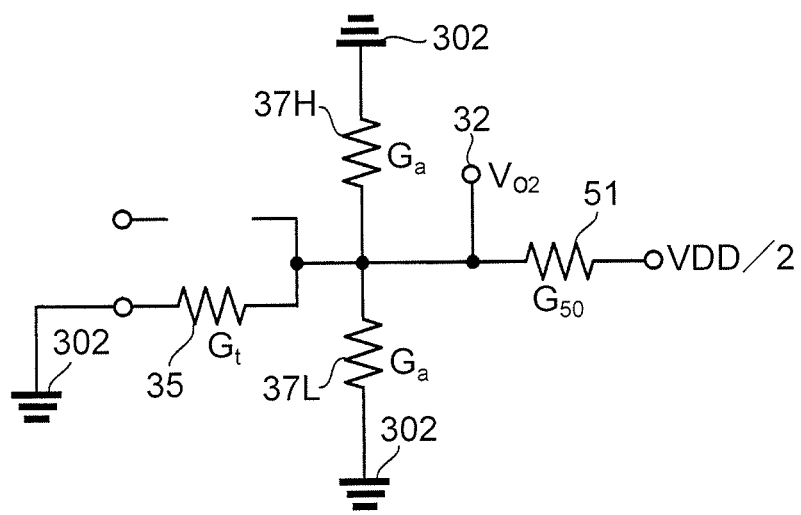
FIG. 14B is a model diagram of a transmitter circuit according to an exemplary embodiment of technology disclosed herein.

FIG. 14B is a model diagram of a case that derives the output voltage $V_{O2}$ generated at the output terminal 32 by the voltage VDD/2 generated at the center point of the differential. In this model, the high potential side current source 38H is in a disconnected state, and one end of the output resistor 35 and the high potential side resistor 37H is short circuited to the low potential line 302. The output voltage $V_{O2}$ is expressed by Equation (8) below.

$$V_{O2} = VDD \times G_{50}/[2 \times (G_t + 2G_a + G_{50})] \tag{8}$$

Figure 14C:
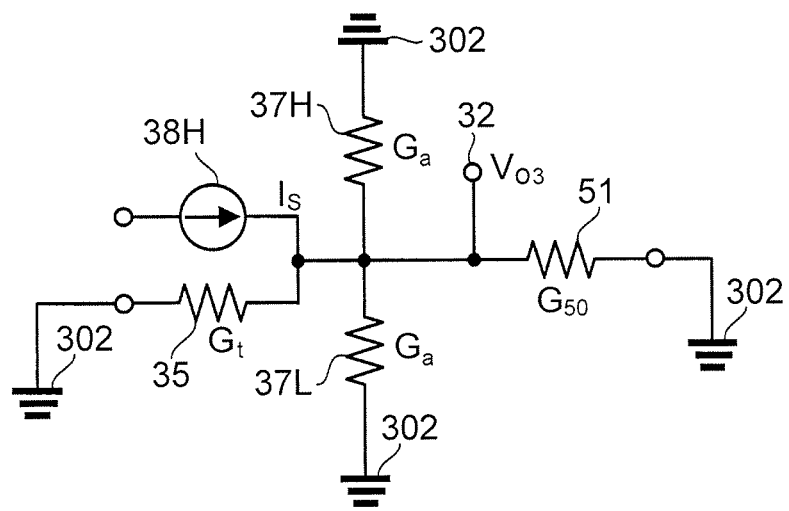
FIG. 14C is a model diagram of a transmitter circuit according to an exemplary embodiment of technology disclosed herein.

FIG. 14C is a model diagram of a case that derives the output voltage $V_{O3}$ generated at the output terminal 32 by the current $I_s$ output from the high potential side current source 38H. In this model, one end of the output resistor 35 and the high potential side resistor 37H, and the center point of the differential, are short circuited to the low potential line 302. The output voltage $V_{O3}$ is expressed by Equation (9) below.

$$V_{O3} = I_s(G_t + 2G_a + G_{50}) \tag{9}$$

The output voltage $V_O$ is expressed by Equation (10) below.

$$V_O = V_{O1} + V_{O2} + V_{O3} = VDD/2 + VDD/2 \times G_t/(G_t + 2G_a + G_{50}) + I_s(G_t + 2G_a + G_{50}) \tag{10}$$

Equation (11) below is established when assuming that the output impedance is adjusted to 50Ω.

$$G_t + 2G_a = G_{50} = 20 \text{ mS} \tag{11}$$

In such cases, Equation (12) below is derived from Equation (10).

$$V_0 - VDD/2 = VDD/4 \times G_t/20 \text{ mS} + I_s \times 25\Omega \tag{12}$$

The output amplitude A of the transmitter circuit 14 is expressed by Equation (13) below.

$$A = 4 \times (V_0 - VDD/2) = VDD \times G_t/20 \text{ mS} + I_s \times 100\Omega \tag{13}$$

Herein, $G_t$ and $G_a$ are defined by Equation (14) and Equation (15) below.

$$G_t = 1/R_t = tc/R_{LSB} \tag{14}$$

$$Ga = 1/R_a = 1/[(2/k_a) \times R_{LSB}] \tag{15}$$

Equation (16) below is derived when Equation (13) is modified based on Equation (11), Equation (14), and Equation (15).

$$A = VDD \times tc/(tc + k_a) + I_s \times 100\Omega \tag{16}$$

Equation (16) is equivalent to Equation (3).

FIG. 15 is table of results found by calculating the variation in output amplitude when the resistance values of the high potential side resistors 37H, 47H and the low potential side resistors 37L, 47L were varied, for the transmitter circuit 14 according to the present exemplary embodiment, and the transmitter circuit 14D according to the comparative example (see FIG. 6). Herein, VDD in Equation (3) is 1V, $I_O$ is 100 µA, and $k_a$ is 2. Moreover, the calculation is performed when output impedance of the SST drivers 30 and 40 are each adjusted to 50Ω. The calculation is performed for a case in which the resistance value $R_a$ of the high potential side resistors 37H, 47H and the low potential side resistors 37L, 47L, and the resistance value $R_{LSB}$ of the resistor elements 84 that configure the output resistors 35, 45 vary by ±30% about 1000Ω. The resistance values of the other resistor elements 80 to 84 that configure the output resistors 35, 45 also vary by ±30%

As illustrated in FIG. 15, in the transmitter circuit 14D according the comparative example, the output amplitude increases accompanying an increase in the value tc of the resistance value setting code TC, and the fluctuation width in the output amplitude becomes 66 mV (from 0.857 V to 0.923 V). In the transmitter circuit 14 according to the present exemplary embodiment, the fluctuation width in the output amplitude becomes 13 mV (from 0.952 V to 0.965 V). Thus in the transmitter circuit 14 according to the present exemplary embodiment, variation in the output amplitude accompanying resistance value variation can be made smaller than in the transmitter circuit 14D according to the comparative example.

As is clear from the above explanation, the output amplitude of the transmitter circuit 14 according to the exemplary embodiment of technology disclosed herein is adjusted to the desired magnitude by the high potential side resistors 37H, 47H and the low potential side resistors 37L, 47L. Moreover, the output resistors 35, 45 are configured as variable resistors, and the resistances value of the output resistors 35, 45 is adjusted such that the resistance value of the output impedance is a specific value even when the resistance values of the high potential side resistors 37H, 47H and the low potential side resistors 37L, 47L vary with PVT. The magnitude of the output current of the high potential side current sources 38H, 48H and the low potential side current sources 38L, 48L is a function of the resistance value setting code TC. More specifically, the magnitude of the output current of the high potential side current sources 38H, 48H and the low potential side current sources 38L, 48L is proportional to the value of the inverted code TCX that is the value of the resistance value setting code TC inverted. Namely, the magnitude of the output current of the high potential side current sources 38H, 48H and the low potential side current sources 38L is set so as to increase in conjunction with the resistance values of the output resistors 35, 45 that are set according to the resistance value setting code TC. The high potential side current sources 38H, 48H and the low potential side current sources 38L, 48L thereby compensate for the variation in the output amplitude accompanying resistance value variation of the high potential side resistors 37H, 47H and the low potential side resistors 37L, 47L with PVT. Since the high potential side resistors 37H, 47H and the low potential side resistors 37L, 47L are configured by fixed resistors in the transmitter circuit 14, the circuit surface area can be decreased compared to the transmitter circuit 14C according to the third comparative example in which these resistors are configured as variable resistors (see FIG. 5). Thus, the transmitter circuit 14 according to the exemplary embodiment of technology disclosed herein can suppress variation in the output amplitude and the output impedance accompanying resistance value variation, while suppressing enlargement of the circuit surface area.

The transmitter circuit 14 according to the present exemplary embodiment has a simple configuration and can obtain a sufficient compensation effect during actual usage due to the magnitude of the output current of the high potential side current sources 38H, 48H and the low potential side current sources 38L, 48L that compensates for variation in the output amplitude being set by the inverted code TCX. Due to employing such a method, processing is simplified compared to cases in which adjustment of resistance values is performed in two dimensions as in the transmitter circuit 14C according to the third comparative example (see FIG. 5).

The magnitude of the output current of the high potential side current sources 38H, 48H and the low potential side current sources 38L, 48L can also be set independently of the inverted code TCX. For example, the high potential side current sources 38H, 48H and the low potential side current sources 38L, 48L may be configured such that the magnitude of the output current $I_s$ satisfies Equation (17) below.

$$I_s = -tc/(tc + k_a) \times I_O + C \tag{17}$$

Herein, C is a constant. The magnitude of the output current of the high potential side current sources 38H, 48H and the low potential side current sources 38L, 48L can completely compensate for variation in the output amplitude by setting according to Equation (17).

Although an example has been given in the present exemplary embodiment of a case in which the code generation circuit 200 generates the resistance value setting code TC, there is no limitation to this mode. For example, the output impedance of the transmitter circuit 14, or the resistance value of a duplicating resistor equivalent thereto, may be measured while inspecting the wafer, and a resistance value setting code TC derived according to the measurement result may be written to a register in the semiconductor integrated circuit 10. In such cases, the resistance value of the output resistors 35, 45 is set based on the resistance value setting code TC written to the register.

Moreover, although an example has been given in the present exemplary embodiment in which only a single set of the high potential side resistors 37H, 47H and the low potential side resistors 37L, 47L is provided, there is no limitation to this mode. The transmitter circuit 14 may be provided with plural resistor sets of the high potential side resistors 37H, 47H and the low potential side resistors 37L, 47L, and configuration may be made such that a desired resistor set is selectable. Making the resistance values mutually different between the resistor sets enables the magnitude of the output amplitude to be switched by selecting a resistor set.

Moreover, although an example has been given in the present exemplary embodiment of a case in which technology disclosed herein is employed for the transmitter circuit that transmits data using a differential signaling method, technology disclosed herein may be employed for a transmitter circuit that transmits data using a single-ended signaling method.

Moreover, although in the present exemplary embodiment, the resistance value of the output resistors 35, 45 is inversely proportional to the value of the resistance value setting code TC, there is no limitation to this mode. The resistance value of the output resistors 35, 45 may have positive correlation with the value of the resistance value setting code TC, and for example, may be proportional to the value of the resistance value setting code TC. In such cases, the current value of each of the current sources is set such that the current value of the high potential side current sources 38H, 48H and the low potential side current sources 38L, 48L have positive correlation with the value of the resistance value setting code TC. For example, the current value of the high potential side current sources 38H, 48H and the low potential side current sources 38L, 48L may be proportional to the value of the resistance value setting code TC. Namely, making the output current of the high potential side current sources 38H, 48H and the low potential side current sources 38L, 48L so as to increase in conjunction with the resistance value of the output resistor 35, 45 set according to the resistance value setting code TC enables an advantageous effect of compensating for variation in the output amplitude to be obtained.

Moreover, an example has been given in the present exemplary embodiment of a case in which the output resistors 35, 45 are configured as variable resistor circuits (see FIG. 9) and the resistance values thereof are changed by the combination of resistor elements 80 to 84; however, there is no limitation to this mode.

Figure 16:
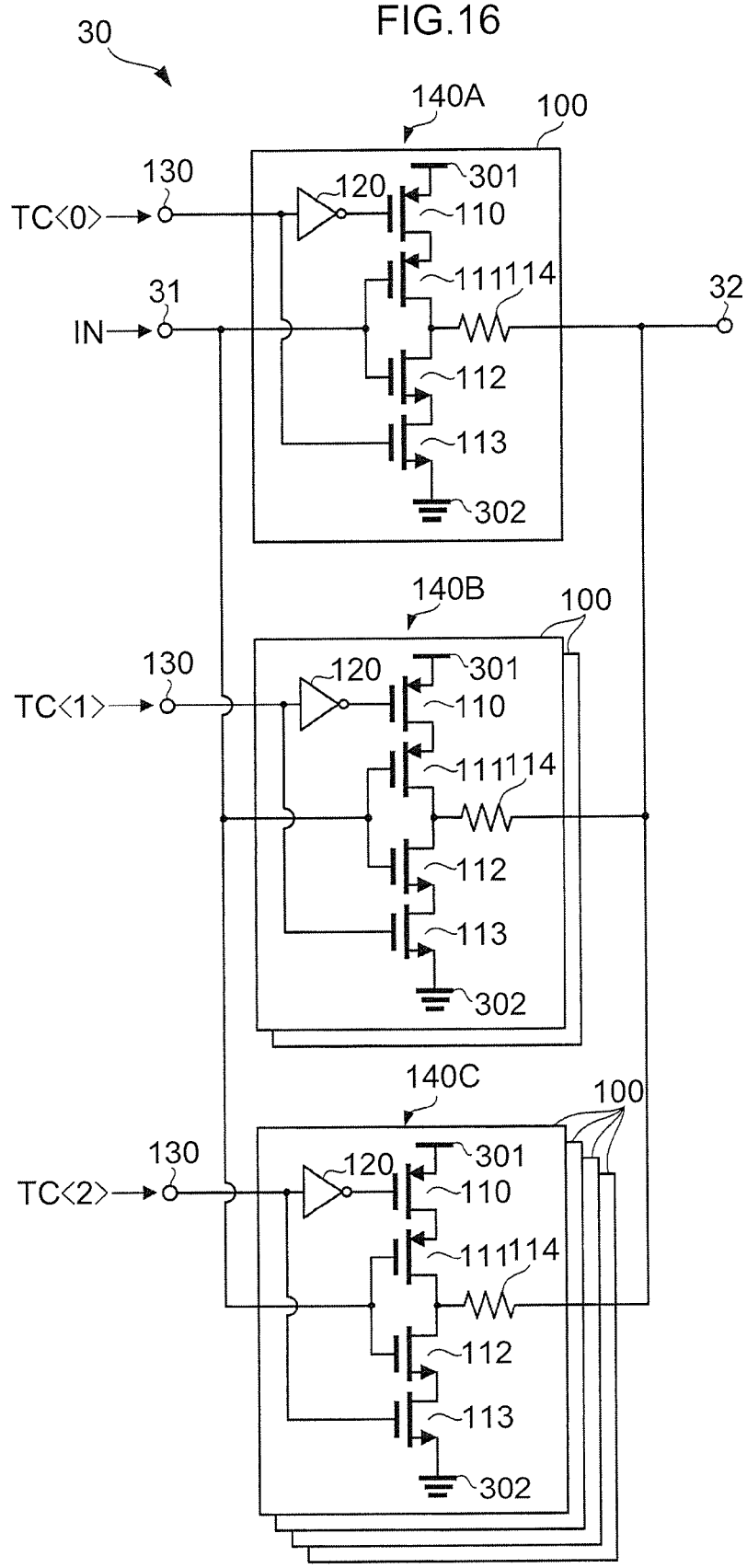
FIG. 16 is a diagram illustrating an example of a configuration of an SST driver according to an exemplary embodiment of technology disclosed herein.

FIG. 16 is a diagram illustrating an example of a configuration of the SST driver 30 in a case in which the output resistor 35 is not configured as variable resistor circuit. As illustrated in FIG. 16, the SST driver 30 may be configured including plural driver units 100. Each of the driver units 100 includes four serially connected transistors (P-MOS transistors 110, 111 and N-MOS transistors 112, 113), and a unit output resistor 114.

The source of the P-MOS transistor 110 is connected to the high potential line 301, the drain is connected to the source of the P-MOS transistor 111, and the gate is connected to the output terminal of a NOT gate 120. The drain of the P-MOS transistor 111 is connected to the drain of the N-MOS transistor 112, and to the output terminal 32 through the unit output resistor 114. The gate of the P-MOS transistor 111 is connected to the gate of the N-MOS transistor 112 and to the input terminal 31. The source of the N-MOS transistor 112 is connected to the drain of the N-MOS transistor 113. The source of the N-MOS transistor 113 is connected to the low potential line 302, and the gate is connected to the input terminal of the NOT gate 120, and to a code input terminal 130 to which the resistance value setting code TC is input.

The SST driver 30 includes a single unit 140A configured by a single driver unit 100, and parallel units 140B and 140C configured by plural driver units 100 connected in parallel. In the present exemplary embodiment, the parallel unit 140B includes two driver units 100 connected in parallel, and the parallel unit 140C includes four driver units 100 connected in parallel.

In the single unit 140A, and the parallel units 140B and 140C, the gates of the P-MOS transistor 111 and the N-MOS transistor 112 are connected to the common input terminal 31, and one end of the unit output resistor 114 is connected to the comment output terminal 32. The single unit 140A, and the parallel units 140B and 140C are each connected to respective independent code input terminals 130. A first bit TC<0> of the resistance value setting code TC is input to the single unit 140A through the code input terminal 130. A second bit TC<1> of the resistance value setting code TC is input to the parallel unit 140B through the code input terminal 130. A third bit TC<2> of the resistance value setting code TC is input to the parallel unit 140C through the code input terminal 130. Although FIG. 16 illustrates an example of a configuration in which the resistance value setting code TC is 3-bit, when the bit count of the resistance value setting code TC is more than 3 bits, the number of parallel units may be increased to correspond to the bit count.

In each of the units 140A, 140B, and 140C the P-MOS transistor 110 and the N-MOS transistor 113 adopt the ON state when the corresponding bit value of the resistance value setting code TC supplied through the code input terminal 130 is "1", and functions of the unit are activated. In each of the units 140A, 140B, and 140C, the P-MOS transistor 110 and the N-MOS transistor 113 adopt the OFF state when the corresponding bit value of the resistance value setting code TC supplied through the code input terminal 130 is "0", and functions of the unit are disabled.

Thus, the resistance value setting code TC sets the single unit 140A, and the parallel units 140B and 140C as activated or disabled, enabling the number of the driver units 100 connected in parallel with one another in the SST driver 30 to be changed. The output impedance of the SST driver 30 can thereby be set by the resistance value setting code TC. According to the configuration illustrated in FIG. 16, the resistance value of the output impedance of the SST driver 30 is inversely proportional to the value of the resistance value setting code TC. Note that the inverted phase side of the inverted phase side SST driver 40 is also configured similarly to the SST driver 30.

Figure 17:
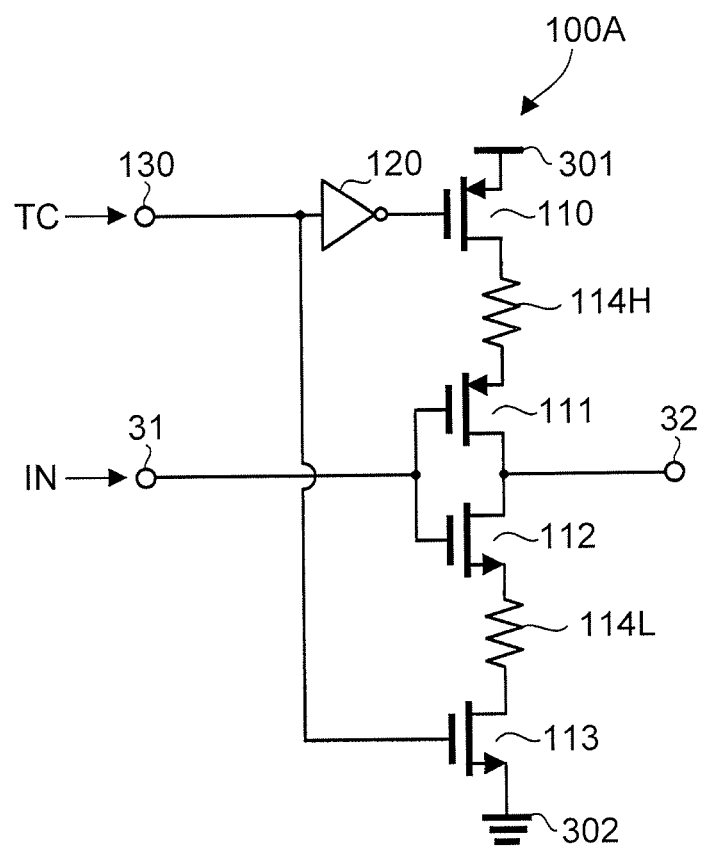
FIG. 17 is a diagram illustrating an example of a configuration of an SST driver according to an exemplary embodiment of technology disclosed herein.
Figure 18:
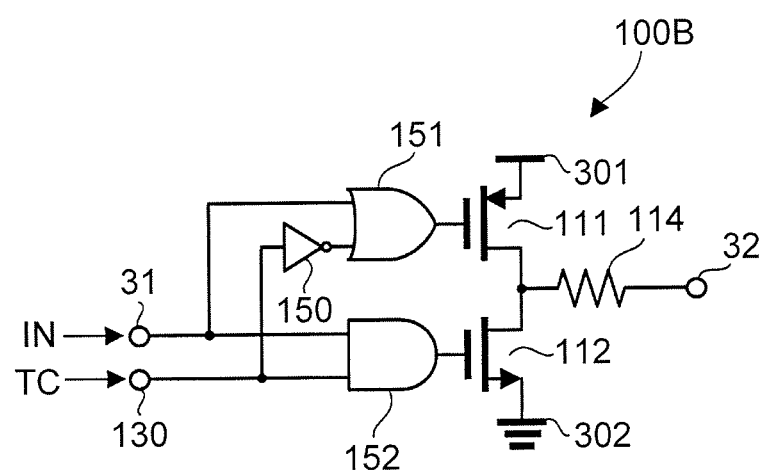
FIG. 18 is a diagram illustrating an example of a configuration of an SST driver according to an exemplary embodiment of technology disclosed herein.

FIG. 17 and FIG. 18 are diagrams illustrating other configurations of the driver units. Configuration elements in the driver units 100A and 100B illustrated in FIG. 17 and FIG. 18 corresponding to or the same as those of the driver unit 100 illustrated in FIG. 16 are allocated the same reference numeral, and duplicate explanation thereof is omitted.

As illustrated in FIG. 17, the driver units 100A includes a unit output resistor 114H between the P-MOS transistor 110 and the P-MOS transistor 111, and includes a unit output resistor 114L between the N-MOS transistor 112 and the N-MOS transistor 113.

As illustrated in FIG. 18, the driver unit 100B includes a P-MOS transistor 111 and an N-MOS transistor 112 connected together in series between the high potential line 301 and the low potential line 302. The gate of the P-MOS transistor 111 is connected to the output terminal of an OR gate 151, and the gate of the N-MOS transistor 112 is connected to the output terminal of an AND gate 152. The point connecting the P-MOS transistor 111 to the N-MOS transistor 112 is connected to the output terminal 32 through the unit output resistor 114. The input terminal 31 is connected to one input terminal of the OR gate 151, and is connected to one input terminal of the AND gate 152. The code input terminal 130 is connected to the other input terminal of the OR gate 151 through a NOT gate 150, and to the other input terminal of the AND gate 152.

The driver units 100A and 100B function similarly to the driver unit 100 illustrated in FIG. 16. The SST drivers 30 and 40 may be configured with the driver unit 100 illustrated in FIG. 16 substituted for the driver unit 100A or the driver unit 100B.

The transmitter circuit 14 is an example of a transmitter circuit of technology disclosed herein. The SST drivers 30 and 40 are examples of drivers of technology disclosed herein. The output resistors 35, 45 are examples of output resistors of technology disclosed herein. The output terminals 32, 42 are examples of output terminals of technology disclosed herein. The high potential side resistors 37H and 47H are examples of high potential side resistors of technology disclosed herein. The low potential side resistors 37L and 47L are examples of low potential side resistors of technology disclosed herein. The high potential side current sources 38H and 48H are examples of high potential side current sources of technology disclosed herein. The low potential side current sources 38L and 48L are examples of low potential side current sources of technology disclosed herein. The high potential side switches 39H and 49H are examples of high potential side switches of technology disclosed herein. The low potential side switches 39L and 49L are examples of low potential side switches of technology disclosed herein. The resistance value setting code TC is an example of an input code of technology disclosed herein. The inverted code TCX is an example of an inverted code of technology disclosed herein. The code generation circuit 200 is an example of a code generation circuit of technology disclosed herein. The inverted code generation circuit 210 is an example of an inverted code generation circuit of technology disclosed herein. The semiconductor integrated circuit 10 is an example of semiconductor integrated circuit of technology disclosed herein. The computation processing circuit 11 is an example of a processing circuit of technology disclosed herein. The parallel-serial convertor circuit 13 is an example of a convertor circuit of technology disclosed herein.

Technology disclosed herein exhibits an advantageous effect of suppressing variations in output amplitude and output impedance with resistance value variation, while suppressing enlargement of a circuit surface area in a transmitter circuit.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A transmitter circuit, comprising:
    a driver that includes an output resistor set to a resistance value according to an input code, and that outputs, to an output terminal, an output signal according to an input signal;
    a high potential side resistor provided between the output terminal and a high potential line supplied with a first voltage;
    a low potential side resistor provided between the output terminal and a low potential line supplied with a second voltage that is lower than the first voltage;
    a high potential side current source that is provided between the output terminal and the high potential line, that is set with a first current value according to the input code, and that outputs a current from the high potential line toward the output terminal;
    a low potential side current source that is provided between the output terminal and the low potential line, that is set with a second current value according to the input code, and that outputs a current from the output terminal toward the low potential line;
    a high potential side switch that is provided between the output terminal and the high potential line, that allows the current output from the high potential side current source to pass through in an ON state, and that blocks the current output from the high potential side current source in an OFF state; and
    a low potential side switch that is provided between the output terminal and the low potential line, that allows the current output from the low potential side current source to pass through in an ON state, and that blocks the current output from the low potential side current source in an OFF state.

2. The transmitter circuit of claim 1, wherein the first current value of the high potential side current source and the second current value of the low potential side current source are set so as to increase in conjunction with the resistance value of the output resistor set according to the input code.

3. The transmitter circuit of claim 1, wherein the driver, the high potential side resistor, the low potential side resistor, the high potential side current source, the low potential side current source, the high potential side switch, and the low potential side switch are included at both a non-inverted phase side and an inverted phase side of a differential signaling path.

4. The transmitter circuit of claim 3, wherein:
    when the driver at the non-inverted phase side outputs a high level output signal, and the driver at the inverted phase side outputs a low level output signal, the high potential side switch at the non-inverted phase side and the low potential side switch at the inverted phase side are in an ON state, and the low potential side switch at the non-inverted phase side and the high potential side switch at the inverted phase side are in an OFF state; and
    when the driver at the non-inverted phase side outputs a low level output signal, and the driver at the inverted phase side outputs a high level output signal, the high potential side switch at the non-inverted phase side and the low potential side switch at the inverted phase side are in an OFF state, and the low potential side switch at the non-inverted phase side and the high potential side switch at the inverted phase side are in an ON state.

5. The transmitter circuit of claim 1, wherein the value of the input code is set such that a resistance value of a combined resistance of the output resistor, the high potential side resistor, and the low potential side resistor, is a specific value.

6. The transmitter circuit of claim 1, wherein:
    the resistance value of the output resistor is inversely proportional to the value of the input code; and the first current value of the high potential side current source and the second current value of the low potential side current source are proportional to the value of an inverted code in which the value of the input code is inverted.

7. The transmitter circuit of claim 6, further comprising:
a code generation circuit that generates the input code; and
an inverted code generation circuit that generates the inverted code.

8. The transmitter circuit of claim 1, wherein the driver includes a pair of serially connected transistors that are provided between the high potential line and the low potential line, and that switch ON and OFF in a complementary manner.

9. The transmitter circuit of claim 1, wherein:
the driver includes a plurality of driver units that are provided between the high potential line and the low potential line, and that each include:
a pair of serially connected transistors that switch ON and OFF in a complementary manner, and
a unit output resistor that is connected to the pair of transistors; and
a number of the driver units that are connected to one another in parallel among the plurality of driver units is set according to the input code.

10. The transmitter circuit of claim 7, wherein the code generation circuit includes:
a duplicating resistor that duplicates the output resistor and that is set to a resistance value according to an input code;
a reference resistor that has a specific resistance value; and
a search section that finds an input code that obtains a resistance value of the duplicating resistor that is close to the resistance value of the reference resistor.

11. A semiconductor integrated circuit, comprising a processing circuit that executes processing, and outputs a result of the processing as parallel data, a convertor circuit that converts the parallel data output from the processing circuit to serial data and outputs the serial data, and a transmitter circuit that externally transmits an output signal according to the serial data output from the convertor circuit, wherein the transmitter circuit includes:
a driver that includes an output resistor set to a resistance value according to an input code, and that outputs, to an output terminal, an output signal according to the serial data;
a high potential side resistor provided between the output terminal and a high potential line supplied with a first voltage;
a low potential side resistor provided between the output terminal and a low potential line supplied with a second voltage that is lower than the first voltage;
a high potential side current source that is provided between the output terminal and the high potential line, that is set with a first current value according to the input code, and that outputs a current from the high potential line toward the output terminal;
a low potential side current source that is provided between the output terminal and the low potential line, that is set with a second current value according to the input code, and that outputs a current from the output terminal toward the low potential line;
a high potential side switch that is provided between the output terminal and the high potential line, that allows the current output from the high potential side current source to pass through in an ON state, and that blocks the current output from the high potential side current source in an OFF state; and
a low potential side switch that is provided between the output terminal and the low potential line, that allows the current output from the low potential side current source to pass through in an ON state, and that blocks the current output from the low potential side current source in an OFF state.

12. The semiconductor integrated circuit of claim 11, wherein the first current value of the high potential side current source and the second current value of the low potential side current source are set so as to increase in conjunction with the resistance value of the output resistor set according to the input code.

13. The semiconductor integrated circuit of claim 11, wherein the driver, the high potential side resistor, the low potential side resistor, the high potential side current source, the low potential side current source, the high potential side switch, and the low potential side switch are included at both a non-inverted phase side and an inverted phase side of a differential signaling path.

14. The semiconductor integrated circuit of claim 13, wherein:
when the driver at the non-inverted phase side outputs a high level output signal, and the driver at the inverted phase side outputs a low level output signal, the high potential side switch at the non-inverted phase side and the low potential side switch at the inverted phase side are in an ON state, and the low potential side switch at the non-inverted phase side and the high potential side switch at the inverted phase side are in an OFF state; and
when the driver at the non-inverted phase side outputs a low level output signal, and the driver at the inverted phase side outputs a high level output signal, the high potential side switch at the non-inverted phase side and the low potential side switch at the inverted phase side are in an OFF state, and the low potential side switch at the non-inverted phase side and the high potential side switch at the inverted phase side are in an ON state.

15. The semiconductor integrated circuit of claim 11, wherein the value of the input code is set such that a resistance value of a combined resistance of the output resistor, the high potential side resistor, and the low potential side resistor, is a specific value.

16. The semiconductor integrated circuit of claim 11, wherein:
the resistance value of the output resistor is inversely proportional to the value of the input code; and
the first current value of the high potential side current source and the second current value of the low potential side current source are proportional to the value of an inverted code in which the value of the input code is inverted.

17. The semiconductor integrated circuit of claim 16, further comprising:
a code generation circuit that generates the input code; and
an inverted code generation circuit that generates the inverted code.

18. The semiconductor integrated circuit of claim 11, wherein the driver includes a pair of serially connected transistors that are provided between the high potential line and the low potential line, and that switch ON and OFF in a complementary manner.

19. The semiconductor integrated circuit of claim 11, wherein:
- the driver includes a plurality of driver units that are provided between the high potential line and the low potential line, and that each include:
  - a pair of serially connected transistors that switch ON and OFF in a complementary manner, and
  - a unit output resistor that is connected to the pair of transistors; and
- a number of the driver units that are connected to one another in parallel among the plurality of driver units is set according to the input code.

20. The semiconductor integrated circuit of claim 17, wherein the code generation circuit includes:
- a duplicating resistor that duplicates the output resistor and that is set to a resistance value according to an input code;
- a reference resistor that has a specific resistance value; and
- a search section that finds an input code that obtains a resistance value of the duplicating resistor that is close to the resistance value of the reference resistor.

* * * * *